United States Patent
Griffiths

(10) Patent No.: US 10,069,071 B2
(45) Date of Patent: *Sep. 4, 2018

(54) POLYCYCLIC AROMATIC HYDROCARBON COPOLYMERS

(71) Applicant: SMARTKEM LIMITED, Manchester (GB)

(72) Inventor: Russell Jon Griffiths, Bolton (GB)

(73) Assignee: SMARTKEM LIMITED, Manchester (GB)

( * ) Notice: Subject to any disclaimer, the term of this patent is extended or adjusted under 35 U.S.C. 154(b) by 88 days.

This patent is subject to a terminal disclaimer.

(21) Appl. No.: 14/911,092

(22) PCT Filed: Aug. 28, 2013

(86) PCT No.: PCT/GB2013/052248
§ 371 (c)(1),
(2) Date: Feb. 9, 2016

(87) PCT Pub. No.: WO2015/028768
PCT Pub. Date: Mar. 5, 2015

(65) Prior Publication Data
US 2016/0204350 A1    Jul. 14, 2016

(51) Int. Cl.
*H01L 51/00* (2006.01)
*C08G 61/12* (2006.01)
*H01L 51/05* (2006.01)

(52) U.S. Cl.
CPC ........ *H01L 51/0043* (2013.01); *C08G 61/126* (2013.01); *H01L 51/0035* (2013.01);
(Continued)

(58) Field of Classification Search
None
See application file for complete search history.

(56) References Cited

U.S. PATENT DOCUMENTS

| | | |
|---|---|---|
| 3,557,233 A | 1/1971 | Zweig et al. |
| 5,998,045 A | 12/1999 | Chen et al. |

(Continued)

FOREIGN PATENT DOCUMENTS

| | | |
|---|---|---|
| EP | 1847544 | 10/2007 |
| EP | 2098527 | 9/2009 |

(Continued)

OTHER PUBLICATIONS

Database CA [Online] Chemical Abstracts Service, Columbus, OH, US; Sep. 10, 2009, Goto, Daisuke et al., "Polymers having benzothieno[3,2-b]benzothiophene structures with good film forming ability and oxidative stability, and high solubility," XP002697699, retrieved from STN Database Accession No. 2009:1103025 abstract -& JP 2009 203447 A (Ricoh Co., Ltd., Japan), Sep. 10, 2009.

(Continued)

*Primary Examiner* — Katie L Hammer
(74) *Attorney, Agent, or Firm* — Parker Highlander PLLC

(57) ABSTRACT

The present invention relates to organic copolymers and organic semiconducting compositions comprising these materials, including layers and devices comprising such organic semiconductor compositions. The invention is also concerned with methods of preparing such organic semiconductor compositions and layers and uses thereof. The invention has application in the field of printed electronics and is particularly useful as a semiconducting material for use in formulations for organic thin film transistor (OTFT) backplanes for displays, integrated circuits, organic light emitting diodes (OLEDs), photodetectors, organic photovoltaic (OPV) cells, sensors, memory elements and logic circuits.

37 Claims, 1 Drawing Sheet

(52) U.S. Cl.
CPC ...... *H01L 51/0036* (2013.01); *H01L 51/0039* (2013.01); *C08G 2261/12* (2013.01); *C08G 2261/312* (2013.01); *C08G 2261/3142* (2013.01); *C08G 2261/3162* (2013.01); *C08G 2261/3243* (2013.01); *C08G 2261/92* (2013.01); *H01L 51/0541* (2013.01); *H01L 51/0545* (2013.01); *H01L 51/0558* (2013.01); *Y02E 10/549* (2013.01); *Y02P 70/521* (2015.11)

(56) References Cited

U.S. PATENT DOCUMENTS

| | | | |
|---|---|---|---|
| 6,690,029 | B1 | 2/2004 | Anthony et al. |
| 7,098,525 | B2 | 8/2006 | Bai et al. |
| 7,576,208 | B2 | 8/2009 | Brown et al. |
| 7,901,594 | B2 | 3/2011 | Takahasi |
| 8,318,048 | B2 | 11/2012 | Tierney et al. |
| 8,398,895 | B2 | 3/2013 | Sparrowe et al. |
| 8,557,953 | B2 | 10/2013 | Heun et al. |
| 2003/0116755 | A1 | 6/2003 | Takahashi |
| 2004/0222412 | A1 | 11/2004 | Bai et al. |
| 2011/0073813 | A1 | 3/2011 | Caldwell et al. |
| 2011/0108813 | A1* | 5/2011 | Kohiro ............. H01L 51/0036 257/40 |
| 2012/0079938 | A1 | 4/2012 | Celik et al. |

FOREIGN PATENT DOCUMENTS

| | | |
|---|---|---|
| EP | 2254171 | 11/2010 |
| GB | 2449023 | 6/2011 |
| JP | 2009 203447 | 9/2009 |
| KR | 20110068665 | 6/2011 |
| WO | WO 2004/102690 | 11/2004 |
| WO | WO 2005/055248 | 11/2004 |
| WO | WO 2007/078993 | 7/2007 |
| WO | WO 2007/082584 | 7/2007 |
| WO | WO 2008/107089 | 9/2008 |
| WO | WO 2008/128618 | 10/2008 |
| WO | WO 2010/136112 | 12/2010 |
| WO | WO 2010/149258 | 12/2010 |
| WO | WO 2010/149261 | 12/2010 |
| WO | WO 2012/052704 | 4/2012 |
| WO | WO 2012/052713 | 4/2012 |
| WO | WO 2012/160382 | 11/2012 |
| WO | WO 2012/160383 | 11/2012 |
| WO | WO 2012/164282 | 12/2012 |

OTHER PUBLICATIONS

Database CA [Online] Chemical Abstracts Service, Columbus, Ohio, US; Jun. 28, 2011 (Jun. 28, 2011), Cho, Nam Seong et al., "Anthracene-based copolymers for organic thin film transistors with good hole mobility and on/off ratio," XP002697861, retrieved from STN Database accession No. 2011:802523; KR 2011 068-665 A (LG Display Co., Ltd., S. Korea) Jun. 22, 2011.
Holland et al, "Effects of order and disorder on field-effect mobilities measured in conjugated polymer thin-film transistors," *J. Appl. Phys.*, 75:7954, 1994.
Jiang et al., "Anthradithiophene-Containing Copolymers for Thin-Film Transistors and Photovoltaic Cells," *Macromolecules*, 43(15):6361-6367, 2010.
Minemawari et al., "Inkjet printing of single-crystal films," *Nature*, 475:364-367, 2011.
Okamoto et al., "Synthesis and Characterization of Pentacene—and Anthradithiophene—Fluorene Conjugated Copolymers Synthesized by Suzuki Reactions," *Macromolecules*, 41(19):6977-6980, 2008.
Osaka et al., "High-mobility semiconducting naphthodithiophene copolymers," *Journal of the American Chemical Society*, 132(14):5000-5001, 2010.
Payne et al., "Robust, soluble pentacene ethers," *Organic Letters*, 6(10):1609-1612, 2004.
Payne et al., "Stable, crystalline acenedithiophenes with up to seven linearly fused rings," *Organic Letters*, 6(19):3325-3328, 2004.
PCT International Search Report and Writen Opinion issued in International Patent Application No. PCT/GB2013/050461, dated Jun. 24, 2013.
PCT International Search Report and Written Opinion issued in International Patent Application No. PCT/GB2013/050457, dated Jul. 4, 2013.
PCT International Search Report and Written Opinion issued in International Patent Application No. PCT/GB2013/050458, dated Jul. 4, 2013.
PCT International Search Report and Written Opinion issued in International Patent Application No. PCT/GB2013/050459, dated Jul. 4, 2013.
PCT International Search Report and Written Opinion issued in International Patent Application No. PCT/GB2013/050460, dated Jun. 24, 2013.
PCT International Search Report and Written Opinion issued in International Patent Application No. PCT/GB2013/050462, dated Jun. 24, 2013.
PCT International Search Report and Written Opinion issued in International Patent Application No. PCT/GB2013/050463, dated Oct. 22, 2013.
PCT International Search Report issued in International Application No. PCT/GB2013/052248, dated Feb. 26, 2014.
Shin et al., "Improvement of efficiency of polymer solar cell by incorporation of the planar shaped monomer in low band gap polymer," *Synthetic Metals*, 162(9):768-774, 2012.
Shinamura et al., "Air-Stable and High-Mobility Organic Semiconductors Based on Heteroarenes for Field-Effect Transistors," *Heterocycles*, 83(6):1187-1204, 2011.
Smith et al., "High-performance organic integrated circuits based on solution processable polymer-small molecule blends," *Applied Physics Letters*, 93(25): 253301, 2008.
Takimiya et al., "2,7-Diphenyl[1]benzothieno[3,2-b]benzothiophene, a new organic semiconductor for air-stable organic field-effect transistors with mobilities up to 2.0 cm2 V(-1) s(-1)," *Journal of the American Chemical Society*, 128(39):12604-12605, 2006.
Zheltov et al, "Investigations in the region of aromatic disulfides. X. Synthesis and properties of 2,2'-disulfide and its derivatives" *Zh. Org. Khim*, 16(2):384-390, 1980. (English translation of Russian text).
Zherdeva et al., "Investigation of the products from the reduction of 2,2'-stilbenedisulfonyl chloride by hydriodic acid," *Zh. Org. Khim*, 16(2):425-429, 1980. (English translation of Russian text).
Zherdeva et al., "Synthesis and transformations of 2,7-disubstituted benzothieno[3,2-b]benzothiophenes," *Zh. Org. Khim*, 16(2):430-438, 1980. (English translation of Russian text).

* cited by examiner

POLYCYCLIC AROMATIC HYDROCARBON COPOLYMERS

This application is a national phase application under 35 U.S.C. § 371 of International Application No. PCT/GB2013/052248, filed Aug. 28, 2013, the entire contents of which is incorporated herein by reference.

FIELD OF THE INVENTION

The present invention relates to organic copolymers and organic semiconducting compositions comprising these materials, including layers and devices comprising such organic semiconductor compositions. The invention is also concerned with methods of preparing such organic semiconductor compositions and layers and uses thereof. The invention has application in the field of printed electronics and is particularly useful as a semiconducting material for use in formulations for organic thin film, transistor (OTFT) backplanes for displays, integrated circuits, organic light emitting diodes (OLEDs), photodetectors, organic photovoltaic (OPV) cells, sensors, memory elements and logic circuits.

BACKGROUND OF THE INVENTION

In recent years, there has been an increasing interest in organic semiconducting materials as an alternative to conventional silicon-based semiconductors. In particular, formulated organic semiconducting materials which comprise in part a polymer component have several advantages over those based on silicon, such as lower cost, easier manufacturing, solution processability at low temperatures as well as increased device flexibility, mechanical robustness, good compatibility with a wide variety of flexible substrates and light weight. They thus offer the possibility of producing more convenient high performance electronic devices.

Polyacene compounds and their analogues in particular have shown promise in this field of technology. WO 2005/055248 for example, discloses an organic semiconducting layer formulation comprising an organic binder which has a permittivity ($\varepsilon$) at 1000 Hz of 3.3 or less, and a polyacene compound. However the method for preparing the OFETs described in WO 2005/055248 in practice is limited and is only useful for producing top gate OFETs having relatively long channel lengths (typically >50 microns). A further disadvantage of WO 2005/055248 that is overcome by the present invention, is that it frequently uses undesirable chlorinated solvents. The highest performance semiconductor compositions disclosed in WO 2005/055248 having mobilities ~1.0 $cm^2V^{-1}s^{-1}$, incorporated 1,2-dichlorobenzene as the solvent (page 54, Table 5 and examples 14, 21 and 25). Moreover these solvents are not ones that would be industrially acceptable in a printing process and these are also damaging to the environment. Therefore it would be desirable to use more benign solvents for the manufacture of these semiconductor compositions.

Furthermore, it is generally thought that only polymer binders with a permittivity of less than 3.3 could be used since any polymers with a higher permittivity resulted in a very significant reduction in mobility values of the OFET device.

This reduction in mobility value can further be seen in WO 2007/078993 which discloses the use of 2,3,9,10-substituted pentacene compounds in combination with insulating polymers having a dielectric constant at 1000 Hz of greater than 3.3. These formulated organic semiconductor compositions are reported to exhibit mobility values of between $10^{-2}$ and $10^{-7}$ $cm^2V^{-1}s^{-1}$ which are too low to be industrially useful.

Therefore, the present invention seeks to provide organic semiconductor compositions, which overcome the above-mentioned problems, by providing copolymers that are soluble in non-chlorinated organic solvents, have tunable permittivity values determined by the ratios of the defined copolymers and which when used in combination with polycrystalline small molecule organic semiconductors afford OSC formulations having sufficiently high solids loadings (>1% total solids), high flexibility and high mobility values in both top gate and bottom gate TFT devices.

SUMMARY OF THE INVENTION

The copolymers and compositions of the invention are expected to produce sufficiently soluble materials that, on deposition, afford flexible, non-brittle layers unlike layers made from solely small molecule semiconducting compounds. The formulations comprising the random copolymers of this invention have significantly higher mobilities than typical organic semiconductor formulations used in the field of printable electronics. The copolymer formulations of the invention will be industrially useful in the fabrication of rollable and flexible electronic devices such as OTFT arrays for displays; large area printed sensors and printed logic. In particular, the copolymer formulations of this invention will be useful in formulations for organic thin film transistors (OTFTs) having short channel lengths (≤30 microns and even ≤5 to 10 microns) that may be used as the backplane driver for electrophoretic displays, high resolution LCD and AMOLED displays.

The copolymers are preferably soluble (>2% by wt.) in benign, non-chlorinated solvents, such as toluene, xylene, mesitylene, tetralin, bromobenzene, bromomesitylene, etc. which are typically used in printing of electronic devices.

The present invention also provides highly flexible, non-brittle, semi-conducting films.

Polycyclic Aromatic Hydrocarbon Copolymers

The copolymers of the present invention are random copolymers.

Polycyclic Aromatic Hydrocarbon random Copolymers (hereinafter PAHCs) according to the first aspect of the present invention comprise a mixture of at least one benzochalcogenophenobenzochalogenophene—(hereafter referred to as BXBX) monomer unit having the Formula (A), and at least one fluorene monomer unit having the Formula (B), and at least one triarylamine monomer unit having the Formula (C):

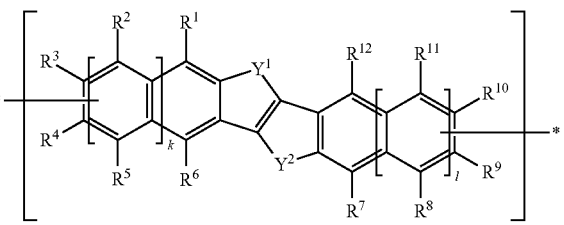

Formula (A)

-continued

Formula (B)

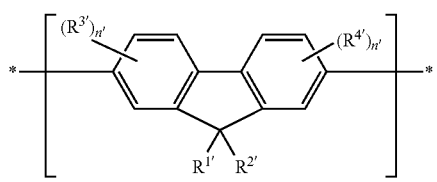

Formula (C)

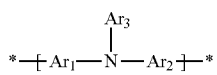

mer group (A), —— * represents a bond to another monomer unit having the Formula (A), (B) or (C)

wherein $Ar_1$, $Ar_2$ and $Ar_3$, which may be the same or different, each represent, independently, an optionally substituted $C_{6-40}$ aromatic group (mononuclear or polynuclear), wherein preferably at least one of $Ar_1$, $Ar_2$ and $Ar_3$ is substituted with at least one polar or polarising groups and for the monomer group (C), —— * represents a bond to another monomer unit having the Formula (A), (B) or (C).

As used above, the term "monomer unit" refers to the residue of the monomer once polymerisation has taken place.

Polycyclic Aromatic Hydrocarbon Copolymers (hereinafter PAHCs) according to the first aspect of the present invention may be represented by the generic Formula (1)

Formula (1)

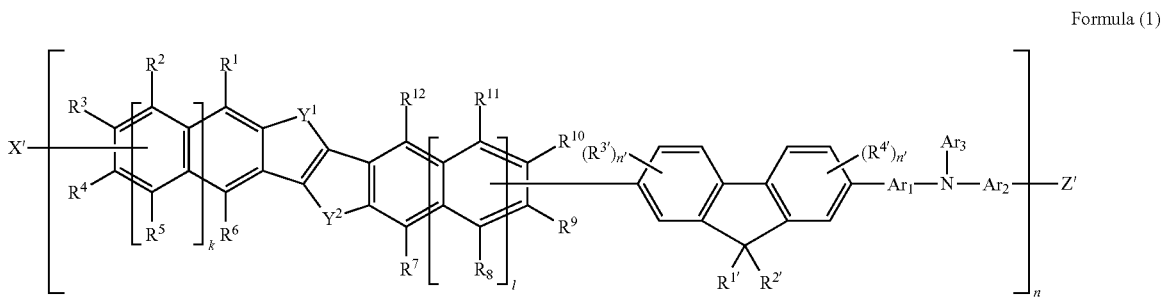

wherein,
$Y^1$ and $Y^2$ are independently S or Se; k is 0 or 1; l is 0 or 1; n' is 0, 1, 2 or 3;
wherein each of $R^1$, $R^2$, $R^3$, $R^4$, $R^5$, $R^6$, $R^7$, $R^8$, $R^9$, $R^{10}$, $R^{11}$ and $R^{12}$, which may be the same or different, independently represents hydrogen; a branched or unbranched, substituted or unsubstituted $C_1$-$C_{40}$ alkyl group; a branched or unbranched, substituted or unsubstituted $C_2$-$C_{40}$ alkenyl group; a branched or unbranched, substituted or unsubstituted $C_2$-$C_{40}$ alkynyl group; an optionally substituted $C_3$-$C_{40}$ cycloalkyl group; an optionally substituted $C_6$-$C_{40}$ aryl group; an optionally substituted $C_1$-$C_{40}$ heterocyclic group; an optionally substituted $C_1$-$C_{40}$ heteroaryl group; an optionally substituted $C_1$-$C_{40}$ alkoxy group; an optionally substituted $C_6$-$C_{40}$ aryloxy group; an optionally substituted $C_7$-$C_{40}$ alkylaryloxy group; an optionally substituted $C_2$-$C_{40}$ alkoxycarbonyl group; an optionally substituted $C_7$-$C_{40}$ aryloxycarbonyl group; a cyano group (—CN); a carbamoyl group (—C(=O)NR$^{15}$R$^{16}$); a carbonyl group (—C(=O)—R$^{17}$); a carboxyl group (—CO$_2$R$^{18}$) a cyanate group (—OCN); an isocyano group (—NC); an isocyanate group (—NCO); a thiocyanate group (—SCN) or a thioisocyanate group (—NCS); an optionally substituted amino group; a hydroxy group; a nitro group; a CF$_3$ group; a halo group (Cl, Br, F, I); —SR$^{19}$; —SO$_3$H; —SO$_2$R$^{20}$; —SF$_5$; an optionally substituted silyl group;
wherein at least two of $R^1$, $R^3$, $R^4$, $R^6$, $R^7$, $R^9$, $R^{10}$, and $R^{12}$, are a bond, represented by —— *, to another monomer unit having the Formula (A), (B), or (C); and wherein each $R^{1'}$, $R^{2'}$, $R^{3'}$ and $R^{4'}$, each of which may be the same or different, is selected from the same group as $R^1$, $R^2$, $R^3$, $R^4$ already defined above for monomer (A) and for the monowherein n is the number of repeat units in the polymer, and X' and Z' are independently selected from halogen groups or cyclic boronate groups, preferably either halogen groups or cyclic boronate groups.

This illustration of Formula (1) is not intended to represent the linear order of the constituent monomer moieties within the copolymer. Thus, the residues of the comonomers of Formula (A), Formula (B), and Formula (C) within the copolymer may be bonded in any order. As mentioned above, the PAHCs of the present invention are random copolymers.

Within this copolymer of Formula (1), the primary function of comonomer (C) is to provide increased mobility of the PAHC. In contrast, the primary function of comonomer (B) is to provide increased permittivity of the PAHC. With this knowledge provided by the present inventors, it is possible for the electronic properties of the PAHC to be tailored by the skilled person in the art.

Preferably, in monomer unit (C), $Ar_1$, $Ar_2$ and $Ar_3$, which may be the same or different, each represent, independently if in different repeat units, an optionally substituted $C_{6-20}$ aromatic group (mononuclear or polynuclear), wherein at least one of $Ar_1$, $Ar_2$ and $Ar_3$ is substituted with at least one polar or more polarising group, and n=1 to 100, preferably 1 to 50, preferably 1 to 20, even more preferably 1 to 10 and more preferably 1 to 5, wherein n refers to the number of monomer units. Preferably, at least one of $Ar_1$, $Ar_2$ and $Ar_3$ is substituted with 1, 2, 3, or 4, more preferably 1, 2 or 3, more preferably 1 or 2, preferably 1 polar or more polarising group(s).

In a preferred embodiment, the one or more polar or polarising group(s) is independently selected from the group consisting of nitro group, nitrile group, $C_{1-40}$ alkyl group substituted with a nitro group, a nitrile group, a cyanate group, an isocyanate group, a thiocyanate group or a thioisocyanate group; $C_{1-40}$ alkoxy group optionally substituted with a nitro group, a nitrile group, a cyanate group, an isocyanate group, a thiocyanate group or a thioisocyanate group; $C_{1-40}$ carboxylic acid group optionally substituted with a nitro group, a nitrile group, a cyanate group, an isocyanate group, a thiocyanate group or a thioisocyanate group; $C_{2-40}$ carboxylic acid ester optionally substituted with a nitro group, a nitrile group, a cyanate group, an isocyanate group, a thiocyanate group or a thioisocyanate group; sulfonic acid optionally substituted with a nitro group, a nitrile group, a cyanate group, an isocyanate group, a thiocyanate group or a thioisocyanate group; sulfonic acid ester optionally substituted with a nitro group, a nitrile group, a cyanate group, an isocyanate group, a thiocyanate group or a thioisocyanate group; cyanate group, isocyanate group, thiocyanate group, thioisocyanate group; and an amino group optionally substituted with a nitro group, a nitrile group, a cyanate group, an isocyanate group, a thiocyanate group or a thioisocyanate group; and combinations thereof.

The PAHC random copolymers specified in Table 1 are particularly preferred as they combine the beneficial properties of high charge transport mobility with a polarity that is more compatible with benign, non-chlorinated solvents that will be desirable for use in large area printing. In addition, as these compounds are more polar once deposited as the OSC layer, or alternatively as a component in the OSC layer, they are expected to be resistant to being re-dissolved by the hydrophobic solvents used for the organic gate insulators (OGI) such as Cytop. Furthermore, it is expected that the polar binders are useful for both top gate and bottom gate OTFTs, particularly for bottom gate OTFTs.

The copolymers according to the present invention preferably have a number average molecular weight (Mn) of between 700 and 100,000, more preferably between 1600 and 20000, more preferably between 2000 and 50,000, more preferably between 2000 and 20,000, even more preferably between 2000 and 10,000.

The copolymers according to the present invention preferably have between 1 and 1000 monomer units having the Formula (A); between 1 and 1000 fluorene monomer units having the Formula (B) and between 1 and 1000 triarylamine monomer units having the Formula (C). More preferably, the copolymers have between 1 and 100 monomer units having the Formula (A) and between 1 and 100 fluorene monomer units having the Formula (B) and between 1 and 100 triarylamine units having the Formula (C)). Yet even more preferably, the copolymers have between 1 and 20 BXBX monomer units having the Formula (A) and between 1 and 20 fluorene monomer units having the Formula (B) and between 1 and 20 triarylamine monomer units having the formula (C). Yet even more preferably, the copolymers have between 5 and 20 BXBX monomer units having the Formula (A) and between 5 and 20 fluorene monomer units having the Formula (B) and between 5 and 20 triarylamine monomer units having the formula (C).

Preferred PAHCs and compositions of the present invention contain at least 10 wt. %, more preferably 15-30% (of the total of all monomer units (A), (B) and (C) in the copolymer or composition) of a heteroacene monomer having the Formula (A) and at least 40 wt. %, preferably 50-85 wt. %, more preferably 50-70 wt. %, of a monomer unit having the Formula (B) and at least 15 wt. %, preferably 20-50% of a monomer unit having the Formula (C), such that the sum total weight of (A)+(B)+(C) is 100%.

The BXBX random copolymers having the structure $(A-B-C)_n$ may be produced according to the following general synthetic regime. For simplicity, a representative BXBX monomer is shown (no further substitutions are shown, the skilled person understanding how this can be genericised to the structures shown above) being coupled to a representative fluorene monomer and triphenylamine monomer.

General Synthesis Route to the PAHC

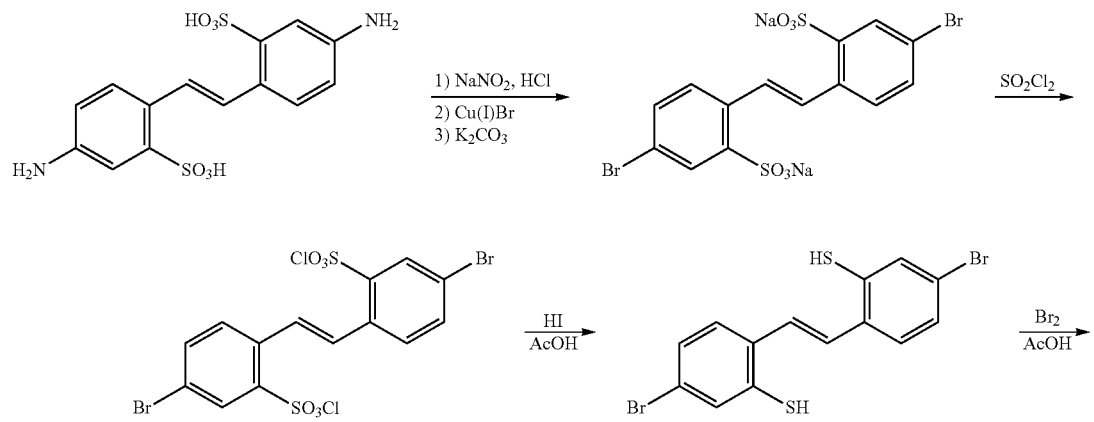

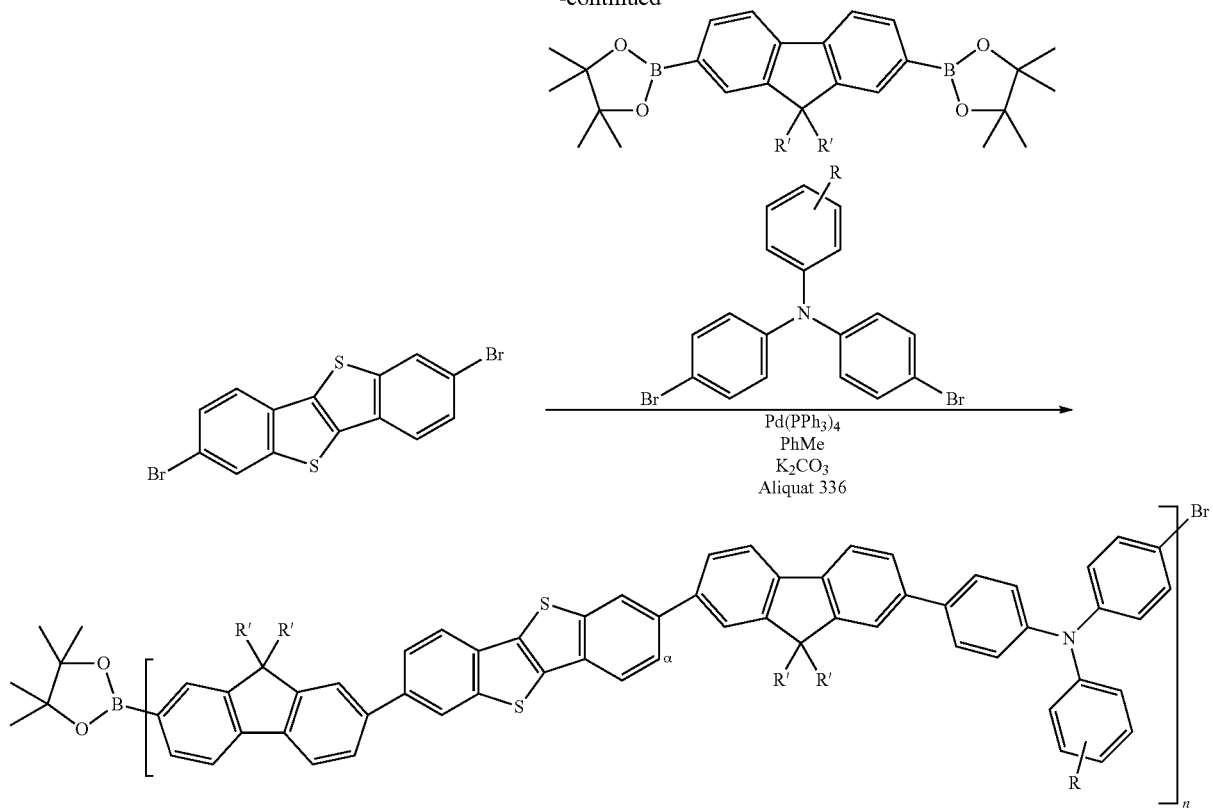

wherein n is an integer of 1-10,000; and R is preferably H or a polar or polarising group as defined below, and R' is the same as $R^{1'}$ and $R^{2'}$ defined above. On completion of the coupling reaction, the halogen and boronic ester end groups are preferably substituted by other groups, for example by hydrogenation and/or hydrolysis respectively.

Following the polymerization step to form the random copolymer of the present invention, the copolymer may be cross-linked. Cross-linking may be achieved by any known technique. Examples include the application of heat and/or moisture, ethylene oxide treatment, UV irradiation, gamma sterilisation, electron beam irradiation, and autoclaving.

Thus, according to another aspect of the present invention, there is provided a process for producing a Polycyclic Aromatic Hydrocarbon Copolymer (PAHC) comprising polymerising a composition containing at least one BXBX monomer selected from the structure A': at least one monomer selected from the Structure B' and at least one monomer selected from the structure C'.

Structure A'

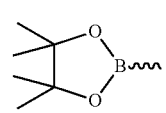

Structure B'

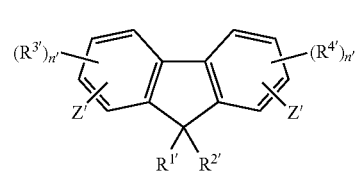

Structure C'

$$Z'—Ar_1—\underset{\underset{Ar_3}{|}}{N}—Ar_2—Z'$$

wherein each of $R^1$-$R^{12}$ groups, $R^{1'}$-$R^{4'}$ groups, $Ar_1$, $Ar_2$ and $Ar_3$, k, l and n' have the same general and preferred definitions as described in relation to the PAHC definitions above; wherein X' and Z' is either a halogen atom or a cyclic boronate group, and wherein at least two of $R^1$, $R^3$, $R^4$, $R^6$, $R^7$, $R^9$, $R^{10}$, and $R^{12}$, are X'.

Preferably, the cyclic boronate group is

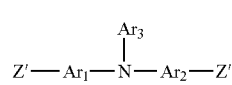

Preferably, the process is carried out in a solvent, preferably an organic solvent, preferably an aromatic organic solvent.

The compositions of the present invention can comprise additional curable monomers, for example, diluent monomers. Examples of suitable materials include radically curable monomer compounds, such as acrylate and methacrylate monomer compounds.

Random copolymers according to the present invention may have a permittivity at 1000 Hz of greater than 1.5, preferably greater than 2, preferably greater than 3. Particularly preferably, copolymers according to the present invention are semiconducting random copolymers having a permittivity at 1000 Hz of between 1.5 and 8, more preferably between 3.4 and 8. In a preferred embodiment, the BXBX copolymers have a permittivity at 1000 Hz of between 3.4 and 7, more preferably between 3.4 and 6.5, and even more preferably between 3.4 and 4.5.

The permittivity of the copolymers can be measured using any standard method known to those skilled in the art. In a preferred embodiment, the permittivity is determined by the method disclosed in WO 2004/102690 or by using the method disclosed herein, preferably by using the method disclosed herein.

Monomer Units of Formula (A)

The following are some preferred characteristics of the BXBX monomer units defined above as (A).

In a preferred embodiment, when k=l=0; $R^1$, $R^3$, $R^4$, $R^6$, $R^7$, $R^9$, $R^{10}$ and $R^{12}$, independently represent H, $C_1$-$C_{14}$ alkyl or $C_1$-$C_6$ alkoxy. In an even more preferred embodiment, $R^1$, $R^3$, $R^4$, $R^6$, $R^7$, $R^9$, $R^{10}$ and $R^{12}$ are the same or different and are selected from the group consisting of hydrogen, methyl, ethyl, propyl, n-butyl, isobutyl, t-butyl, n-octyl, methoxy, ethoxy, propyloxy and butyloxy, provided that at least at least one of each pair of $R^3$/$R^4$ and $R^9$/$R^{10}$ are a bond, represented by ——*, to another monomer unit having the Formula (A), (B) or (C).

Especially preferred BXBX monomer units according to the present invention are those of Formula (A1)

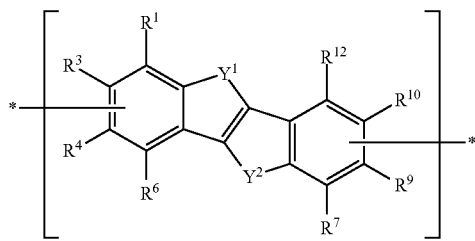

Formula (A1)

Wherein preferably is $Y^1$=$Y^2$=S $R^1$, $R^3$, $R^4$, $R^6$, $R^7$, $R^9$, $R^{10}$ and $R^{12}$ are the same or different and are independently selected from the group consisting of hydrogen, methyl, ethyl, propyl, n-butyl, isobutyl, t-butyl, n-octyl, methoxy, ethoxy, propyloxy and butyloxy, more preferably hydrogen, methyl, propyl and methoxy.

In monomer units of Formula (A1), $R^1$, $R^3$, $R^4$, $R^6$, $R^7$, $R^9$, $R^{10}$ and $R^{12}$ are independently selected from the group consisting of hydrogen, $C_1$-$C_{14}$ alkyl and $C_1$-$C_6$ alkoxy, provided that at least one of each pair of $R^3$/$R^4$ and $R^9$/$R^{10}$ are a bond, represented by ——*, to another monomer unit having the Formula (A1), (B) or (C). In a preferred embodiment, $R^3$, $R^4$, $R^9$ and $R^{10}$ are the same or different and are independently selected from the group consisting of hydrogen, methyl, ethyl, propyl, n-butyl, isobutyl, t-butyl, n-octyl, methoxy, ethoxy, propyloxy and butyloxy, more preferably hydrogen, methyl, ethyl, propyl, n-octyl and methoxy, provided that at least one of each pair of $R^3$/$R^4$ and $R^9$/$R^{10}$ are a bond, represented by ——*, to another monomer unit having the Formula (A1), (B) or (C).

Preferred PAHCs and compositions of the present invention contain at least 10 wt. %, more preferably 15-30% (of the total of all monomer units (A1), (B) and (C) in the copolymer or composition) of a heteroacene monomer having the Formula (A1) and at least 40 wt. %, preferably 50-85 wt. %, of a monomer unit having the Formula (B) and at least 15 wt. %, preferably at 20-50% of a monomer unit having the Formula (C), such that the sum total weight of (A1)+(B)+(C) is 100%.

The "R" substituents (that is $R^1$, $R^2$, etc.) denote the substituents at the positions of the heteroacene according to conventional nomenclature:

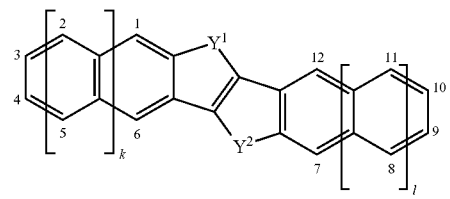

BXBX monomers according to the present invention may be synthesised by any known method within the common general knowledge of a person skilled in the art. In a preferred embodiment, methods disclosed in EP 2098527, EP 2254171, in the journal, Heterocycles, 2011, Volume 83, pages 1187 and in Zh. Org. Khim, 1980, Volume 16, pages 384, 425 and 430, can be employed for the synthesis of heteroacene compounds used in the present invention. High permittivity analogues of the PAHCs of the invention may be prepared according to WO2012/160383 and WO2012/164282.

Monomer Units (B)

The following are some preferred characteristics of the fluorene monomer unit defined above as (B).

In monomer unit (B), preferably each $R^{1'}$, $R^{2'}$, $R^{3'}$, $R^{4'}$, each of which may be the same or different, is selected from hydrogen; a branched or unbranched, substituted or unsubstituted $C_1$-$C_{10}$ alkyl group; a branched or unbranched, substituted or unsubstituted $C_2$-$C_{10}$ alkenyl group; a branched or unbranched, substituted or unsubstituted $C_2$-$C_{10}$ alkynyl group; an optionally substituted $C_3$-$C_{10}$ cycloalkyl group; an optionally substituted $C_6$-$C_{10}$ aryl group; an optionally substituted $C_1$-$C_{10}$ heterocyclic group; an optionally substituted $C_1$-$C_{10}$ heteroaryl group; an optionally substituted $C_1$-$C_{10}$ alkoxy group; an optionally substituted $C_6$-$C_{10}$ aryloxy group; an optionally substituted $C_7$-$C_{10}$ alkylaryloxy group; an optionally substituted $C_2$-$C_{10}$ alkoxycarbonyl group; an optionally substituted $C_7$-$C_{20}$ aryloxycarbonyl group; a cyano group (—CN); a carbamoyl group (—C(=O)NR$^{15}$R$^{16}$); a carbonyl group (—C(=O)—R$^{17}$); a carboxyl group (—CO$_2$R$^{18}$) a cyanate group (—OCN); an isocyano group (—NC); an isocyanate group (—NCO); a thiocyanate group (—SCN) or a thioisocyanate group (—NCS); an optionally substituted amino group; a hydroxy group; a nitro group; a CF$_3$ group; a halo group (01, Br, F, I); —SR$^{19}$; —SO$_3$H; —SO$_2$R$^{20}$; —SF$_5$; an optionally substituted silyl group.

Preferably, each $R^{1'}$, and $R^{2'}$, each of which may be the same or different, is selected from the group consisting of $C_{4-10}$ alkyl, more preferably $C_{6-8}$ alkyl, more preferably, $C_{4-10}$ n-alkyl, more preferably $C_{6-8}$ n-alkyl, most preferably n-octyl.

Preferably, $R^{3'}$ and $R^{4'}$ are H.

Monomer Units (C)

The following are some preferred characteristics of the triarylamine monomer unit defined above as (C), Preferably, in monomer unit (C), $Ar_1$, $Ar_2$ and $Ar_3$, which may be the same or different, each represent, independently if in different repeat units, an optionally substituted $C_{6-20}$ aromatic group (mononuclear or polynuclear), wherein at least one of $Ar_1$, $Ar_2$ and $Ar_3$ is substituted with at least one polar or more polarising group, and n=1 to 100, preferably 1 to 50, preferably 1 to 20, even more preferably 1 to 10 and more preferably 1 to 5, wherein n refers to the number of monomer units. Preferably, at least one of $Ar_1$, $Ar_2$ and $Ar_3$ is substituted with 1, 2, 3, or 4, more preferably 1, 2 or 3, more preferably 1 or 2, preferably 1 polar or more polarising group(s).

In a preferred embodiment, the one or more polar or polarising group(s) is independently selected from the group consisting of nitro group, nitrile group, $C_{1-40}$ alkyl group substituted with a nitro group, a nitrile group, a cyanate group, an isocyanate group, a thiocyanate group or a thioisocyanate group; $C_{1-40}$ alkoxy group optionally substituted with a nitro group, a nitrile group, a cyanate group, an isocyanate group, a thiocyanate group or a thioisocyanate group; $C_{1-40}$ carboxylic acid group optionally substituted with a nitro group, a nitrile group, a cyanate group, an isocyanate group, a thiocyanate group or a thioisocyanate group; $C_{2-40}$ carboxylic acid ester optionally substituted with a nitro group, a nitrile group, a cyanate group, an isocyanate group, a thiocyanate group or a thioisocyanate group; sulfonic acid optionally substituted with a nitro group, a nitrile group, a cyanate group, an isocyanate group, a thiocyanate group or a thioisocyanate group; sulfonic acid ester optionally substituted with a nitro group, a nitrile group, a cyanate group, an isocyanate group, a thiocyanate group or a thioisocyanate group; cyanate group, isocyanate group, thiocyanate group, thioisocyanate group; and an amino group optionally substituted with a nitro group, a nitrile group, a cyanate group, an isocyanate group, a thiocyanate group or a thioisocyanate group; and combinations thereof.

In a more preferred embodiment, the one or more polar or polarising group(s) is independently selected from the group consisting of nitro group, nitrile group, $C_{1-10}$ alkyl group substituted with a nitrile group, a cyanate group, or an isocyanate group; $C_{1-20}$ alkoxy group, $C_{1-20}$ carboxylic acid group, $C_{2-20}$ carboxylic acid ester; sulfonic acid ester; cyanate group, isocyanate group, thiocyanate group, thioisocyanate group, and an amino group; and combinations thereof.

More preferably the polar or polarizing group is selected from the group consisting of $C_{1-4}$ cyanoalkyl group, $C_{1-10}$ alkoxy group, nitrile group and combinations thereof.

More preferably the polar or polarizing group(s) is selected from the group consisting of cyanomethyl, cyanoethyl, cyanopropyl, cyanobutyl, methoxy, ethoxy, propoxy, butoxy, nitrile, $NH_2$ and combinations thereof. Preferably at least one of —$Ar_1$, $Ar_2$ and $Ar_3$ is substituted with 1 or 2 polar or more polarising group, which may be the same or different.

Yet more preferably, polar or polarizing group(s) is selected from the group consisting of isopropyl cyano, cyclohexylcyano, methoxy, ethoxy, nitrile and combinations thereof. Preferably at least one of $Ar_1$, $Ar_2$ and $Ar_3$ is substituted with 1 or 2 polar or more polarising group, which may be the same or different.

More preferably, polar or polarizing group(s) is selected from the group consisting of methoxy, ethoxy, propoxy, butoxy and combinations thereof, wherein at least one of —$Ar_1$, $Ar_2$ and $Ar_3$ is substituted with 1 or 2 polar or more polarising group, which may be the same or different.

More preferably, polar or polarizing group(s) is selected from the group consisting of methoxy and ethoxy, wherein at least one of $Ar_1$, $Ar_2$ and $Ar_3$ is substituted with 1 or 2 of the same polar or more polarising group.

In the context of $Ar_1$, $Ar_2$ and $Ar_3$, a mononuclear aromatic group has only one aromatic ring, for example phenyl or phenylene. A polynuclear aromatic group has two or more aromatic rings which may be fused (for example napthyl or naphthylene), individually covalently linked (for example biphenyl) and/or a combination of both fused and individually linked aromatic rings. Preferably each —$Ar_1$, $Ar_2$ and $Ar_3$ is an aromatic group which is substantially conjugated over substantially the whole group.

Preferably, $Ar_1$, $Ar_2$ and $Ar_3$, are independently selected from the group consisting of $C_{6-20}$ aryl, $C_{7-20}$ aralkyl and $C_{7-20}$ alkaryl, any of which may be substituted with 1, 2, or 3 groups independently selected from $C_{1-4}$ alkoxy, $C_{3-20}$ cycloalkylcyano, $C_{1-4}$ cyanoalkyl, CN and mixtures thereof, and preferably n=1 to 10, wherein n refers to the number of monomer units.

Preferably, $Ar_1$, $Ar_2$ and $Ar_3$, are independently selected from the group consisting of $C_{6-10}$ aryl, $C_{7-12}$ aralkyl and $C_{7-12}$ alkaryl, any of which may be substituted with 1, 2, or 3 groups independently selected from $C_{1-2}$ alkoxy, $C_{1-3}$ cyanoalkyl, CN and mixtures thereof, and preferably n=1 to 10.

Preferably, $Ar_1$, $Ar_2$ and $Ar_3$, are independently selected from the group consisting of $C_{6-20}$ aryl, substituted with 1 or 2 groups independently selected from $C_{1-4}$ alkoxy, $C_{3-20}$ cycloalkylcyano, $C_{1-4}$ cyanoalkyl, CN and mixtures thereof, and preferably n=1 to 10.

Preferably, $Ar_1$, $Ar_2$ and $Ar_3$, are independently selected from the group consisting of $C_{6-10}$ aryl, wherein $Ar_3$, is substituted with 1 or 2 $C_{1-4}$ alkoxy, and preferably n=1 to 10.

Preferably, $Ar_1$, $Ar_2$ and $Ar_3$, are independently selected from the group consisting of $C_{6-10}$ aryl, wherein $Ar_3$ is substituted with 1 $C_{1-4}$ alkoxy, and preferably n=1 to 10.

Preferably, $Ar_1$, $Ar_2$ and $Ar_3$, are independently selected from the group consisting of phenyl, benzyl, tolyl and naphthyl, any of which may be substituted with 1, 2 or 3 groups independently selected from methoxy, ethoxy, cyanomethyl, cyanoethyl, CN and mixtures thereof, and preferably n=1 to 10.

Preferably, $Ar_1$, $Ar_2$ and $Ar_3$, are all phenyl, wherein $Ar_3$ is substituted with 1 or 2 $C_{1-4}$ alkoxy, and preferably n=1 to 10.

Preferably, $Ar_1$, $Ar_2$ and $Ar_3$, are all phenyl which may be independently substituted with 1, 2 or 3 groups selected from methoxy, ethoxy, isprorylcyano, cyanomethyl, cyanoethyl, CN and mixtures thereof, and preferably n=1 to 10.

Preferably, $Ar_1$, $Ar_2$ and $Ar_3$, are all phenyl which may be independently substituted with 1 or 2 groups selected from methoxy, ethoxy, cyanomethyl, CN and mixtures thereof, and preferably n=1 to 10.

Preferably, $Ar_1$, $Ar_2$ and $Ar_3$, are all phenyl which may be independently substituted with 1 or 2 groups selected from methoxy, ethoxy and mixtures thereof, and preferably n=1 to 10.

Preferably, $Ar_1$, $Ar_2$ and $Ar_3$, are all phenyl which may be independently substituted with 2,4-dimethoxy, 2-cyano, 2-methoxy, 2-ethoxy, 4-methoxy, 4-ethoxy, 4-isopropylcyano and 4-cyclohexylcyano, and preferably n=1 to 10.

Preferably, $Ar_1$, $Ar_2$ and $Ar_a$, are all phenyl which may be independently substituted with 2,4-dimethoxy, 2-methoxy, 2-ethoxy, 4-methoxy and 4-ethoxy, and preferably n=1 to 10.

Particularly preferred examples of monomer unit (C) are represented as (F) to (J) below:

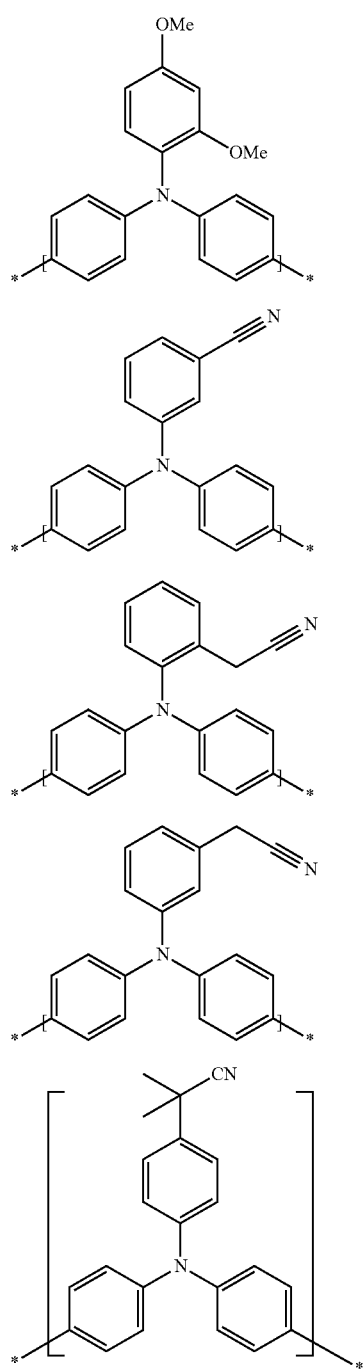

The copolymers of the present invention are random copolymers of different monomer units. In such a case, any monomer unit defined by Formula (A) or (A1) (B) or (C), may be combined with a different or same monomer unit of (A), (B) or (C) provided that at least one monomer unit (A) or (A1) is bonded to at least one monomer unit (B) or (C).

Preferably, the random copolymers of the present invention contain the same groups Formula (A), (A1), (B) or (C), i.e., there is only one species of each of these comonomers in the copolymer.

The ratio of the monomers in the polycyclic aromatic hydrocarbon copolymers can be altered to allow for adjustment of the permittivity and/or mobility and/or solubility relative to a homopolymer.

Furthermore, optionally the monomer units of (A), (B) or (C) may be mixed with cis/trans-indenofluorene monomer units represented by (D), (ID') or spirobifluorene monomer units represented by (E).

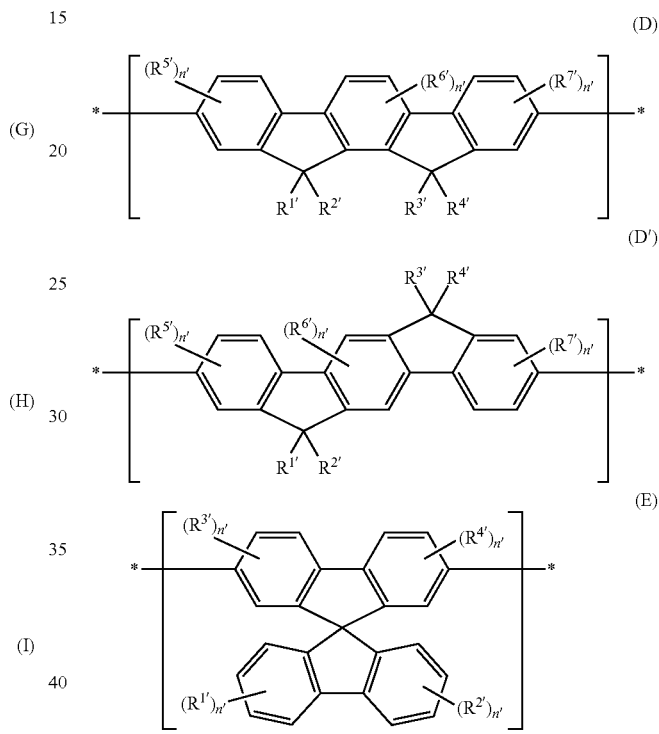

wherein each $R^{1'}$, $R^{2'}$, $R^{3'}$, $R^{4'}$, $R^{5'}$, $R^{6'}$ and $R^{7'}$, each of which may be the same or different, is selected from the same group as $R^1$, $R^2$, $R^3$, $R^4$, $R^5$, $R^6$ and $R^7$, already defined above, and n'=1 to 3.

Where monomer units represented by (D), (D') or spirobifluorene monomer units represented by (E) are included in the copolymer of the present invention, monomer (A) is preferably present in an amount of at least 10 wt. %; monomer (D), (D') and or (E) is present in an amount of at least 10 wt. %, preferably 20-60 wt. %, and at least 15 wt. %, preferably 20-50 wt. % of a monomer unit having the Formula (C).

Organic Semiconductor Compositions

The present invention is concerned with organic semiconductor compositions. In a first aspect of the present invention, the organic semiconductor composition comprises a PAHC comprising a mixture of at least one BXBX monomer unit having the Formula (A) or (A1), at least one monomer unit having the Formula (B) and at least one monomer unit having the Formula (C).

An organic semiconductor composition according to the present invention comprises a copolymer composition, the composition having a permittivity at 1000 Hz of greater than 1.5, more preferably greater than 3.4, and yet more preferably between 1.5 and 6.5, even more preferably between 3 and 6.5, more preferably between 3.0 to 5.0 and still more preferably between 3.4 to 4.5.

The organic semiconductor composition according to the present invention contains a polycyclic aromatic hydrocarbon copolymer (PAHC) as herein disclosed. In a preferred embodiment, an organic semiconductor composition may comprise an unpolymerised PAHC as defined herein, further comprising a polycrystalline polyacene small molecule semiconductor, for example, as described in our application WO 2012/164282, wherein the PAHC has a permittivity at 1000 Hz of between 3.4 and 8, preferably between 3.4 and 6.5, more preferably between 4 and 6.5, yet more preferably between 3.4 to 4.5. In a preferred embodiment, a copolymer as defined herein may be used in combination with a polyacene small molecule or an optionally substituted benzochalcogenophenobenzochalogenophene 'BXBX' small molecule (for example, as described in EP1847544A1 and Nature (2011) Volume 475, pages 362-367), where the 'dried state' composition contains between 10 to 50% of the polyacene small molecule and 10 to 90% of the PAHC. By unpolymerised, it is meant that the small molecule PAHC has not been incorporated into the copolymer backbone by polymerisation.

Thus, the polycrystalline polyacene small molecule semiconductor that can be incorporated in the present compostions preferably has the Formula (2):

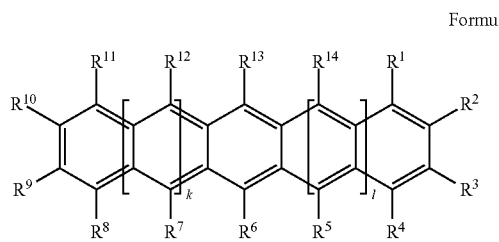

Formula (2)

wherein the definitions of $R^1$-$R^{14}$, k and l have the same general and preferred meaning as disclosed in WO 2012/164282, which is incorporated herein by reference. Especially preferred polycrystalline polyacene small molecules which may be included in the compositions of the present invention include those of Formulae (3) and (4):

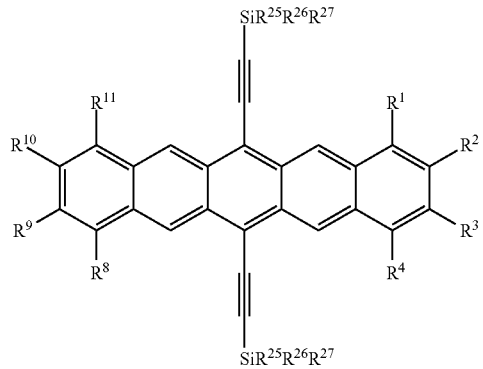

Formula (3)

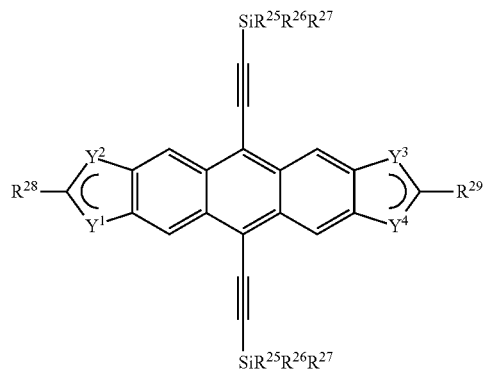

Formula (4)

wherein $R^1$, $R^4$, $R^8$ and $R^{11}$ are independently selected from the group consisting of H, $C_1$-$C_6$ alkyl and $C_1$-$C_6$ alkoxy. Preferably $R^1$, $R^4$, $R^8$ and $R^{11}$ are the same or different and are independently selected from the group consisting of hydrogen, methyl, ethyl, propyl, n-butyl, isobutyl, t-butyl, methoxy, ethoxy, propyloxy and butyloxy, more preferably hydrogen, methyl, propyl and methoxy.

In compounds of Formula (3), $R^2$, $R^3$, $R^9$ and $R^{10}$ are independently selected from the group consisting of H, $C_1$-$C_6$ alkyl and $C_1$-$C_6$ alkoxy, or each pair of $R^2$ and $R^3$ and/or $R^9$ and $R^{10}$, are cross-bridged to form a $C_4$-$C_{10}$ saturated or unsaturated ring, which saturated or unsaturated ring may be intervened by an oxygen atom, a sulphur atom or a group shown by formula —N($R^{21}$)— (wherein $R^{21}$ is a hydrogen atom or a cyclic, straight chain or branched $C_1$-$C_{10}$ alkyl group); and wherein one or more of the carbon atoms of the polyacene skeleton may optionally be substituted by a heteroatom selected from N, P, As, O, S, Se and Te. In a preferred embodiment, $R^2$, $R^3$, $R^9$ and $R^{10}$ are the same or different and are independently selected from the group consisting of hydrogen, methyl, ethyl, propyl, n-butyl, isobutyl, t-butyl, methoxy, ethoxy, propyloxy and butyloxy, more preferably hydrogen, methyl, ethyl, propyl and methoxy;

In compounds of Formulae (3) and (4), $R^{25}$, $R^{26}$ and $R^{27}$ are independently selected from the group consisting of $C_1$-$C_6$ alkyl and $C_2$-$C_6$ alkenyl, preferably $R^{22}$, $R^{23}$ and $R^{24}$ are independently selected from the group consisting of methyl, ethyl, propyl, isopropyl, n-butyl, isobutyl, t-butyl, 1-propenyl and 2-propenyl, more preferably ethyl, n-propyl and isopropyl.

In compounds of Formula (4), $R^{28}$ and $R^{29}$ are independently selected from the group consisting of hydrogen, halogen, —CN, optionally fluorinated or perfluorinated, straight chain or branched $C_1$-$C_{20}$ alkyl, fluorinated or perfluorinated, straight chain or branched $C_1$-$C_{20}$ alkoxy, fluorinated or perfluorinated $C_6$-$C_{30}$ aryl and $CO_2R^{30}$, wherein $R^{30}$ is H, fluorinated or perfluorinated, straight chain or branched $C_1$-$C_{20}$ alkyl, and fluorinated or perfluorinated $C_6$-$C_{30}$ aryl. Preferably $R^{28}$ and $R^{29}$ are independently selected from the group consisting of fluorinated or perfluorinated, straight chain or branched $C_1$-$C_8$ alkyl, fluorinated or perfluorinated, straight chain or branched $C_1$-$C_8$ alkoxy and $C_6F_5$.

In compounds of Formula (4), $Y^1$, $Y^2$, $Y^3$ and $Y^4$ are preferably independently selected from the group consisting of —CH=, =CH—, O, S, Se or $NR^{31}$ (wherein $R^{31}$ is a hydrogen atom or a cyclic, straight chain or branched $C_1$-$C_{10}$ alkyl group).

In an alternative embodiment, the non-polymerised BXBX small molecule semiconductor that can be incorporated in the present compostions preferably has the Formula (5):

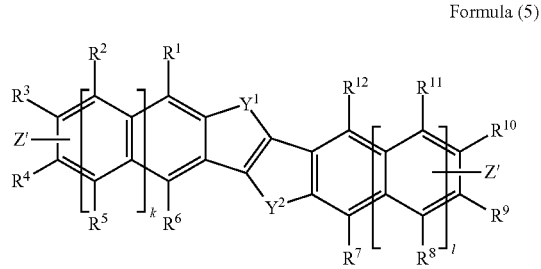

Formula (5)

wherein the PAHC has a permittivity at 1000 Hz of between 3.4 and 8.0, preferably between 3.4 and 4.5, and wherein k is 0 or 1; l is 0 or 1, preferably k is 0 and l is 0; wherein each of $R^1$, $R^2$, $R^3$, $R^4$, $R^5$, $R^6$, $R^7$, $R^8$, $R^9$, $R^{10}$, $R^{11}$ and $R^{12}$, which may be the same or different, independently represents hydrogen; a branched or unbranched, substituted or unsubstituted $C_1$-$C_{40}$ alkyl group; a branched or unbranched, substituted or unsubstituted $C_2$-$C_{40}$ alkenyl group; a branched or unbranched, substituted or unsubstituted $C_2$-$C_{40}$ alkynyl group; an optionally substituted $C_3$-$C_{40}$ cycloalkyl group; an optionally substituted $C_6$-$C_{40}$ aryl group; an optionally substituted $C_1$-$C_{40}$ heterocyclic group; an optionally substituted $C_1$-$C_{40}$ heteroaryl group; an optionally substituted $C_1$-$C_{40}$ alkoxy group; an optionally substituted $C_6$-$C_{40}$ aryloxy group; an optionally substituted $C_7$-$C_{40}$ alkylaryloxy group; an optionally substituted $C_2$-$C_{40}$ alkoxycarbonyl group; an optionally substituted $C_7$-$C_{40}$ aryloxycarbonyl group; a cyano group (—CN); a carbamoyl group (—C(=O)NR$^{15}$R$^{16}$); a carbonyl group (—C(=O)—R$^{17}$); a carboxyl group (—CO$_2$R$^{18}$) a cyanate group (—OCN); an isocyano group (—NC); an isocyanate group (—NCO); a thiocyanate group (—SCN) or a thioisocyanate group (—NCS); an optionally substituted amino group; a hydroxy group; a nitro group; a CF$_3$ group; a halo group (Cl, Br, F, I); —SR$^{19}$; —SO$_3$H; —SO$_2$R$^{20}$; —SF$_5$; an optionally substituted silyl group, and wherein Z' is a halogen, a cyclic boronate, or has the same meaning as $R^1$.

The organic semiconductor composition according to the present invention comprises a polycyclic aromatic hydrocarbon random copolymer PAHC as herein disclosed.

In a preferred embodiment, a PAHC of the invention preferably has a permittivity at 1000 Hz of between 3.4 and 8.0, preferably between 3.4 and 4.5.

The concentration of the PAHC and solvent present in the composition will vary depending on the preferred solution coating method, for example ink jet printing compositions require low viscosity, low solids loading compositions, whilst screen printing processes require high viscosity, high solids loading compositions. Following deposition of the copolymer composition, the solvent is preferably evaporated to afford the semiconductor layer having 1-99.9% by weight of the binder and 0.1 to 99% by weight of the copolymer (in the printed or dried state) based on a total weight of the composition; preferably the semiconductor layer having 25 to 75% by weight of the small molecule polyacene (or small molecule BXBX) and 25 to 75% by weight of the copolymer.

In the composition prior to deposition, one or more of the above-described PAHCs is preferably present at a concentration of at least 0.1 wt %, preferably 0.5 wt % based on a total weight of the composition. The upper limit of the concentration of the PAHC in the composition is often near the solubility limit of that copolymer in the particular solvent at the temperature of the composition during its application to a substrate such as in the fabrication of an electronic device. Typical compositions of the present invention comprise one of the PAHCs at a concentration ranging from about 0.1 wt %, preferably 0.5 wt % to about 20.0 wt % based on a total weight of the composition, more typically, from about 0.5 wt % to about 10.0 wt %, more typically 0.5 to 5.0 wt %, more typically 1 to 3 wt %.

In the printed or dried composition, one or more of the above-described PAHCs is preferably present at a concentration of at least 10 wt % based on a total weight of the composition, preferably between 10 and 90 wt %, more preferably between 20 and 80 wt %, more preferably between 30 and 70 wt %, more preferably between 40 and 70 wt %.

In a preferred embodiment, one or more solvents may be present in the organic semiconductor compositions.

Suitable solvents include, but are not limited to, tetrahydrofuran, aromatic hydrocarbons such as toluene, o-xylene, m-xylene, p-xylene, mesitylene, bromomesitylene, anisole, bromoanisole, bromobenzene, tetralin, o-xylene, 1,4-dioxane, methylethylketone, gamma-butyrolactone, cyclohexanone, morpholine, N-methylpyrrollidone, ethyl acetate, n-butyl acetate, dimethylformamide, dimethylacetamide, decalin or mixtures of two or more thereof. Preferably, no chlorinated solvents are used or present.

Solvent blends may also be utilised. Suitable solvent blends include, but are not limited to compositions of the above solvents in conjunction with solvents such as dimethylformamide, dimethylacetamide, dimethylsulfoxide, methyl ethyl ketone, dichloromethane, dichlorobenzene, furfuryl alcohol, dimethoxyethane and ethyl acetate, higher boiling point alkanes such as n-heptane and alcohols such as isopropyl alcohol. Such compositions (prior to deposition) preferably contain a suitable solvent in an amount of greater than 50 wt % based on a total weight of the composition, preferably between 60 and 95 wt % based on a total weight of the composition.

In yet another preferred embodiment, one or more additional composition components may be present in the organic semiconductor composition. Suitable additional composition components include, but are not limited to, a polymer additive, a rheological modifier, a surfactant, another semiconductor that is a matched hole transfer compound for the copolymer. In some exemplary embodiments, the compositions comprise a polymer additive selected from the group consisting of polystyrene, poly(alpha-methylstyrene), poly(pentafluorostyrene), poly(methyl methacrylate), poly(4-cyanomethyl styrene), poly(4-vinylphenol), or any other suitable polymer disclosed in U.S. Patent Publication No. 2004/0222412 A1 or U.S. Patent Publication No. 2007/0146426 A1. In some desired embodiments, the polymer additive comprises polystyrene, poly(alpha-methylstyrene), poly(pentafluorostyrene) or poly(methyl methacrylate). In some exemplary embodiments, the compositions comprise a surfactant selected from fluorinated surfactants or fluorosurfactants. When present, each additional composition component is independently present in an amount of greater than 0 to about 50 wt % based on a total weight of the composition. Preferably, each additional composition component is independently present in an amount ranging from about 0.0001 to about 10.0 wt % based on a total weight of the composition. For example, when a polymer is present in the composition, the polymer additive is typically present in an amount of greater than 0 to about 5.0 wt %, preferably from about 0.5 to about 3.0 wt % based on a total weight of the composition. For example, when a surfactant is present in the composition, the surfactant is preferably present in an amount of greater than 0 to about 1.0 wt %, more typically, from about 0.001 to about 0.5 wt % based on a total weight of the composition.

The organic semiconductor composition according to the present invention preferably has a charge mobility value of at least 0.5 $cm^2V^{-1}s^{-1}$, preferably between 0.5 and 8.0 $cm^2V^{-1}s^{-1}$, more preferably between 2.0 and 6.0 $cm^2V^{-1}s^{-1}$, more preferably between 2.0 and 8.0 $cm^2V^{-1}s^{-1}$. The charge mobility value of the semiconductor composition can be measured using any standard method known to those skilled in the art, such as techniques disclosed in J. Appl. Phys., 1994, Volume 75, page 7954 and WO 2005/055248, preferably by those described in WO 2005/055248.

The organic semiconductor composition according to the present invention may be prepared by any known method within the common general knowledge of a person skilled in the art. In a preferred embodiment, the organic semiconductor composition is prepared by the method disclosed in WO 2005/055248 or by using the method disclosed herein, preferably by using the method disclosed herein.

Preferably, organic semiconductor compositions according to the present invention are semiconducting compositions having a permittivity at 1000 Hz greater than 1.5, more preferably greater than 3.4, and yet more preferably, between 3.4 and 8. In a preferred embodiment, the compositions have a permittivity at 1000 Hz of between 4.0 and 7, more preferably between 4.0 and 6.5, even more preferably between 4.0 and 6 and yet more preferably between 3.4 and 4.5.

An important aspect of the present invention is that the PAHC copolymers of the present invention are soluble in the presence of the small molecule organic semiconductor in the formulation. Preferably, the copolymer of the invention is soluble in an amount of 0.3 wt. %-3 wt. % when in the presence of the small molecule organic semiconductor, preferably 0.5 wt. %-2 wt. %. A particularly preferred composition contains 1.5-2.5 wt. % (total solids) in a ratio of 20-50:50-80 small molecule organic semiconductor: PAHC, preferably 1.6-2.2 wt. % (total solids) in a ratio of 25-40:60-75 small molecule organic semiconductor:PAHC, most preferably about 1.7 wt. % (total solids) in a ratio of about 30:70 small molecule organic semiconductor:PAHC (i.e., about 1.19% binder).

Organic Semiconductor Layers

The present invention is also concerned with organic semiconductor layers. In a first aspect of the present invention, the organic semiconductor layer comprises a PAHC comprising a mixture of at least one BXBX monomer unit having the Formula (A) or (A1), at least one monomer unit having the Formula (B) and at least one monomer unit having the Formula (C).

The organic semiconductor compositions according to the present invention may be deposited onto a variety of substrates, to form organic semiconductor layer(s).

The organic semiconductor layer according to the present invention may be prepared using a method comprising the steps of:
(i) Mixing the organic semiconductor composition according to the present invention with a solvent to form a semiconductor layer formulation;
(ii) Depositing said formulation onto a substrate; and
(iii) Optionally removing the solvent to form an organic semiconductor layer.

Useful substrate materials include, but are not limited to, polymeric films such as polyamides, polycarbonates, polyimides, polyketones, polyethylene terephthalate (PET) and polyethylene naphthalate (PEN), and inorganic substrates such as silica, alumina, silicon wafers and glass. The surface of a given substrate may be treated, e.g. by reaction of chemical functionality inherent to the surface with chemical reagents such as silanes or exposure of the surface to plasma, in order to alter the surface characteristics.

Prior to depositing the organic semiconductor composition onto the substrate, the composition may be combined with one or more solvents in order to facilitate the deposition step. Suitable solvents include any solvent which is able to dissolve both the copolymer, and which upon evaporation from the solution blend, give a coherent, defect-free layer. Suitable solvents for the copolymer can be determined by preparing a contour diagram for the material as described in ASTM Method D 3132 at the concentration at which the mixture will be employed. The material is added to a wide variety of solvents as described in the ASTM method.

Suitable solvents include, but are not limited to, tetrahydrofuran, aromatic hydrocarbons such as toluene, o-xylene, m-xylene, p-xylene, mesitylene, bromomesitylene, anisole, bromoanisole, bromobenzene, tetralin, o-xylene, 1,4-dioxane, methylethylketone, gamma-butyrolactone, cyclohexanone, morpholine, N-methylpyrollidone, ethyl acetate, n-butyl acetate, dimethylformamide, dimethylacetamide, decalin or mixtures of two or more thereof. Preferably, no chlorinated solvents are used.

In accordance with the present invention it has further been found that the level of the solids content in the organic semiconducting layer formulation is also a factor in achieving improved mobility values for electronic devices such as OFETs. The solids content of the formulation is commonly expressed as follows:

$$\text{Solids content } (\%) = \frac{a+b}{a+b+c} \times 100$$

wherein: a=mass of polyacene small molecule (or small molecule BXBX), b=mass of PAHC and c=mass of solvent.

The solids content of the formulation is preferably 0.1 to 10% by weight, more preferably 0.5 to 5% by weight.

Suitable conventional deposition methods include, but are not limited to, spin coating, spray coating, blade/slot-die coating, flexographic printing, gravure printing, roll-to-roll web-coating, and dip coating, as well as printing processes such as ink-jet printing, screen printing, and offset lithography. In one desired embodiment, the resulting composition is a printable composition, even more desirably, an ink jet printable composition.

Once the composition is deposited onto a substrate surface, the solvent may be removed to form an organic semiconductor layer. Any suitable method may be used to remove the solvent. For example, the solvent may be removed by evaporation or drying. Typically, at least about 80 percent of the solvent is removed to form the semiconductor layer. For example, at least about 85 weight percent, at least about 90 weight percent, at least about 92 weight percent, at least about 95 weight percent, at least about 97 weight percent, at least about 98 weight percent, at least about 99 weight percent, or at least about 99.5 weight percent of the solvent is removed.

The solvent often can be evaporated at any suitable temperature. In some methods, the solvent mixture is evaporated at ambient temperature. In other methods, the solvent is evaporated at a temperature higher or lower than ambient temperature. For example, a plate supporting the substrate can be heated or cooled to a temperature higher or lower than ambient temperature. In still other preferred methods, some or most of the solvent can be evaporated at ambient temperature, and any remaining solvent can be evaporated at a temperature higher than ambient temperature. In methods where the solvent evaporates at a temperature higher than ambient temperature, the evaporation can be carried out under an inert atmosphere, such as a nitrogen atmosphere.

Alternatively, the solvent can be removed by application of reduced pressure (i.e., at a pressure that is less than atmospheric pressure) such as through the use of a vacuum. During application of reduced pressure, the solvent can be removed at any suitable temperature such as those described above.

The rate of removal of the solvent can affect the resulting semiconductor layer. For example, if the removal process is too rapid, poor packing of the semiconductor molecules can occur during crystallisation. Poor packing of the semiconductor molecules can be detrimental to the charge mobility of the semiconductor layer. The solvent can evaporate entirely on its own in an uncontrolled fashion (i.e., no time constraints), or the conditions can be controlled in order to control the rate of evaporation. In order to minimise poor packing, the solvent can be evaporated while slowing the evaporation rate by covering the deposited layer. Such conditions can lead to a semiconductor layer having a relatively high degree of crystallinity.

After removal of a desired amount of solvent to form the semiconductor layer, the semiconductor layer can be annealed by exposure to heat or solvent vapours, i.e., by thermal annealing or solvent annealing.

The charge mobility value of the semiconductor layer can be measured using any standard method known to those skilled in the art, such as techniques disclosed in *J. Appl. Phys.*, 1994, Volume 75, page 7954 and WO 2005/055248, preferably by those described in WO 2005/055248.

Preferably, the organic semiconductor layer(s) of the present invention are semiconducting layers having a permittivity at 1000 Hz of between 3.4 and 8. In a preferred embodiment, the layer(s) have a permittivity at 1000 Hz of between 4.0 and 7, more preferably between 4.0 and 6.5, yet more preferably between 4.0 and 6 and even more preferably between 3.4 and 4.5

Electronic Devices

The invention additionally provides an electronic device comprising the organic semiconductor composition according to the present invention. In a first aspect of the present invention, the electronic device may comprise an organic semiconductor composition comprising a PAHC comprising a mixture of at least one BXBX monomer unit having the Formula (A), at least one monomer unit having the Formula (B) and at least one monomer unit having the Formula (C). The composition may be used, for example, in the form of a semiconducting layer or film. Additionally, the invention preferably provides an electronic device comprising the organic semiconductor layer according to the present invention.

The thickness of the layer or film may be between 0.02 and 20 microns, 0.2 and 20 microns, preferably between 0.05 and 10 microns, preferably between 0.5 and 10 microns, between 0.05 and 5 microns, even more preferably between 0.5 and 5 microns, yet more preferably between 0.5 and 2 microns, and more preferably between 0.02 and 1 microns.

The electronic device may include, without limitation, organic field effect transistors (OFETS), organic light emitting diodes (OLEDS), photodetectors, organic photovoltaic (OPV) cells, sensors, lasers, memory elements and logic circuits.

Exemplary electronic devices of the present invention may be fabricated by solution deposition of the above-described organic semiconductor composition onto a substrate.

DETAILED DESCRIPTION OF THE INVENTION

General

For the heteroacene monomers used in the invention whilst one isomer is shown the invention applies to pure cis isomer, pure trans isomer and mixtures of cis and trans isomers.

The term "about" in relation to a numerical value x means, for example, x±10%.

The word "substantially" does not exclude "completely" e.g. a composition which is "substantially free" from Y may be completely free from Y. Where necessary, the word "substantially" may be omitted from the definition of the invention.

"Molecular weight" of a polymeric material (including monomeric or macromeric materials), as used herein, refers to the number-average molecular weight unless otherwise specifically noted or unless testing conditions indicate otherwise.

'n' represents an integer and is the number of repeat units of specified monomer in the polymer.

A "polymer" means a material formed by polymerising and/or crosslinking one or more monomers, macromers and/or oligomers and having two or more repeat units.

As used herein, the term "alkyl" group refers to a straight or branched saturated monovalent hydrocarbon radical, having the number of carbon atoms as indicated. By way of non limiting example, suitable alkyl groups include, methyl, ethyl, propyl, n-butyl, t-butyl, iso-butyl and dodecanyl.

As used herein, the term "alkoxy" group include without limitation, methoxy, ethoxy, 2-methoxyethoxy, t-butoxy, etc.

As used herein, the term "amino" group includes, without limitation, dimethylamino, methylamino, methylphenylamino, phenylamino, etc.

The term "carbyl" refers to any monovalent or multivalent organic radical moiety which comprises at least one carbon atom other without any non-carbon atoms (—C≡O), or optionally combined with at least one non-carbon atoms such as N, O, S, P, SI, Se, As, Te or Ge (for example carbonyl etc.).

The term "hydrocarbon" group denotes a carbyl group that additionally contains one or more H atoms and optionally contains one or more hetero atoms.

A carbyl or hydrocarbyl group comprising 3 or more carbon atoms may be linear, branched and/or cyclic, including spiro and/or fused rings.

Preferred carbyl or hydrocarbyl groups include alkyl, alkoxy, alkylcarbonyl, alkylcarbonyloxy, alkoxycarbonyloxy, each of which is optionally substituted and has 1 to 40, preferably 1 to 18 carbon atoms, furthermore optionally substituted aryl, aryl derivative or aryloxy having 6 to 40, preferably 6 to 18 carbon atoms, furthermore alkylaryloxy, arylcarbonyl, aryloxycarbonyl, arylcarbonyloxy and aryloxycarbonyloxy, each or which is optionally substituted and has 7 to 40, more preferable 7 to 25 carbon atoms.

The carbyl or hydrocarbyl group may be saturated or unsaturated acyclic group, or a saturated or unsaturated cyclic group. Unsaturated acyclic or cyclic groups are preferred, especially alkenyl and alkynyl groups (especially ethynyl).

In the polyacenes of the present invention, the optional substituents on the said $C_1$-$C_{40}$ carbyl or hydrocarbyl groups for $R_1$-$R_{14}$ etc. preferably are selected from: silyl, sulpho, sulphonyl, formyl, amino, imino, nitrilo, mercapto, cyano, nitro, halo, $C_{1-4}$ alkyl, $C_{6-12}$ aryl, $C_{1-4}$ alkoxy, hydroxy and/or all chemically possible combinations thereof. More preferable among these optional substituents are silyl and $C_{6-12}$ aryl and most preferable is silyl.

"Substituted alkyl group" refers to an alkyl group having one or more substituents thereon, wherein each of the one or more substituents comprises a monovalent moiety containing one or more atoms other than carbon and hydrogen either alone (e.g., a halogen such as F) or in combination with carbon (e.g., a cyano group) and/or hydrogen atoms (e.g., a hydroxyl group or a carboxylic acid group).

"Alkenyl group" refers to a monovalent group that is a radical of an alkene, which is a hydrocarbon with at least one carbon-carbon double bond. The alkenyl can be linear, branched, cyclic, or combinations thereof and typically contains 2 to 30 carbon atoms. In some embodiments, the alkenyl contains 2 to 20, 2 to 14, 2 to 10, 4 to 10, 4 to 8, 2 to 8, 2 to 6, or 2 to 4 carbon atoms. Exemplary alkenyl groups include, but are not limited to, ethenyl, propenyl, and butenyl.

"Substituted alkenyl group" refers to an alkenyl group having (i) one or more C=C double bonds, and (ii) one or more substituents thereon, wherein each of the one or more substituents comprises a monovalent moiety containing one or more atoms other than carbon and hydrogen either alone (e.g., a halogen such as F) or in combination with carbon (e.g., a cyano group) and/or hydrogen atoms (e.g., a hydroxyl group or a carboxylic acid group).

"Cycloalkyl group" refers to a monovalent group that is a radical of a ring structure consisting of 3 or more carbon atoms in the ring structure (i.e., only carbon atoms in the ring structure and one of the carbon atoms of the ring structure is the radical).

"Substituted cycloalkyl group" refers to a cycloalkyl group having one or more substituents thereon, wherein each of the one or more substituents comprises a monovalent moiety containing one or more atoms (e.g., a halogen such as F, an alkyl group, a cyano group, a hydroxyl group, or a carboxylic acid group).

"Cycloalkylalkylene group" refers to a monovalent group that is a ring structure consisting of 3 or more carbon atoms in the ring structure (i.e., only carbon atoms in the ring), wherein the ring structure is attached to an acyclic alkyl group (typically, from 1 to 3 carbon atoms, more typically, 1 carbon atom) and one of the carbon atoms of the acyclic alkyl group is the radical. "Substituted cycloalkylalkylene group" refers to a cycloalkylalkylene group having one or more substituents thereon, wherein each of the one or more substituents comprises a monovalent moiety containing one or more atoms (e.g., a halogen such as F, an alkyl group, a cyano group, a hydroxyl group, or a carboxylic acid group).

"Aryl group" refers to a monovalent group that is a radical of an aromatic carbocyclic compound. The aryl can have one aromatic ring or can include up to 5 carbocyclic ring structures that are connected to or fused to the aromatic ring. The other ring structures can be aromatic, non-aromatic, or combinations thereof. Examples of preferred aryl groups include, but are not limited to, phenyl, 2-tolyl, 3-tolyl, 4-tolyl, biphenyl, 4-phenoxyphenyl, 4-fluorophenyl, 3-carbomethoxyphenyl, 4-carbomethoxyphenyl, terphenyl, anthryl, naphthyl, acenaphthyl, anthraquinonyl, phenanthryl, anthracenyl, pyrenyl, perylenyl, and fluorenyl.

"Substituted aryl group" refers to an aryl group having one or more substituents on the ring structure, wherein each of the one or more substituents comprises a monovalent moiety containing one or more atoms (e.g., a halogen such as F, an alkyl group, a cyano group, a hydroxyl group, or a carboxylic acid group).

"Arylalkylene group" refers to a monovalent group that is an aromatic ring structure consisting of 6 to 10 carbon atoms in the ring structure (i.e., only carbon atoms in the ring structure), wherein the aromatic ring structure is attached to an acyclic alkyl group having one or more carbon atoms (typically, from 1 to 3 carbon atoms, more typically, 1 carbon atom) and one of the carbons of the acyclic alkyl group is the radical.

"Substituted arylalkylene group" refers to an arylalkylene group having one or more substituents thereon, wherein each of the one or more substituents comprises a monovalent moiety containing one or more atoms (e.g., a halogen such as F, an alkyl group, a cyano group, a hydroxyl group, or a carboxylic acid group).

"Acetyl group" refers to a monovalent radical having the formula —C(O)CH$_3$.

"Heterocyclic ring" refers to a saturated, partially saturated, or unsaturated ring structure comprising at least one of O, N, S and Se in the ring structure.

"Substituted heterocyclic ring" refers to a heterocyclic ring having one or more substituents bonded to one or more members of the ring structure, wherein each of the one or more substituents comprises a monovalent moiety containing one or more atoms (e.g., a halogen such as F, an alkyl group, a cyano group, a hydroxyl group, or a carboxylic acid group).

"Carbocyclic ring" refers to a saturated, partially saturated, or unsaturated ring structure comprising only carbon in the ring structure.

"Substituted carbocyclic ring" refers to a carbocyclic ring having one or more substituents bonded to one or more members of the ring structure, wherein each of the one or more substituents comprises a monovalent moiety containing one or more atoms (e.g., a halogen such as F, an alkyl group, a cyano group, a hydroxyl group, or a carboxylic acid group).

"Ether group" refers to a —$R_a$—O—$R_b$ radical wherein $R_a$ is a branched or unbranched alkylene, arylene, alkylarylene or arylalkylene hydrocarbon and $R_b$ is a branched or unbranched alkyl, aryl, alkylaryl or arylalkyl hydrocarbon.

"Substituted ether group" refers to an ether group having one or more substituents thereon, wherein each of the one or more substituents comprises a monovalent moiety containing one or more atoms other than carbon and hydrogen either alone (e.g., a halogen such as F) or in combination with carbon (e.g., a cyano group) and/or hydrogen atoms (e.g., a hydroxyl group or a carboxylic acid group).

Unless otherwise defined, a "substituent" or "optional substituent" is preferably selected from the group consisting of halo (I, Br, Cl, F), CN, NO$_2$, NH$_2$, —COOH and OH.

The term "polarising group" refers to a substituent or substituents (which may be an element or chemical group) attached to a group in which the element or chemical group has a significant difference in electronegativity to the group it is chemically bound to. This causes a perturbation in the electron density (compared to an unsubstituted group) giving rise to the formation of a permanent dipole. The presence of a permanent dipole gives rise to an increase in the dielectric constant (otherwise known as relative permittivity) of the compound.

Figure 1:
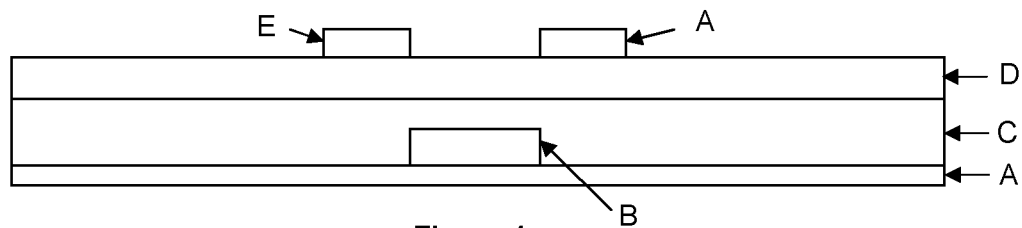
FIG. 1 is a representation of bottom gate/top contact (BG/TC) organic thin film transistor (OTFT)
Figure 2:
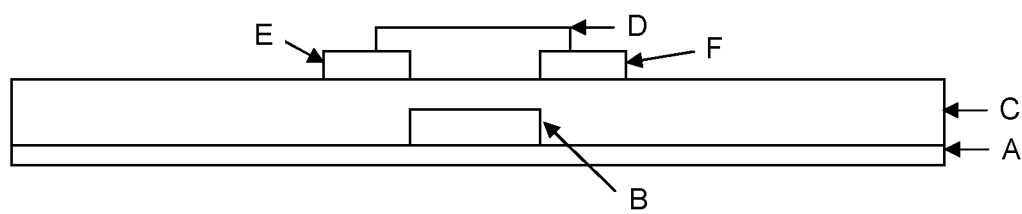
FIG. 2 is a representation of bottom gate/bottom contact (BG/BC)
Figure 3:
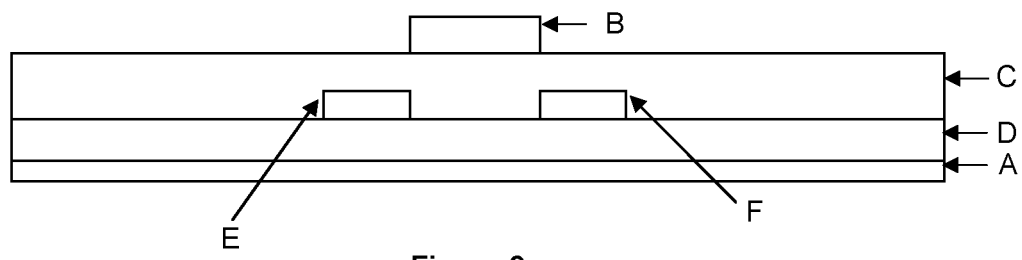
FIG. 3 is a representation of a top gate/top contact (TG/TC) (OTFT)
Figure 4:
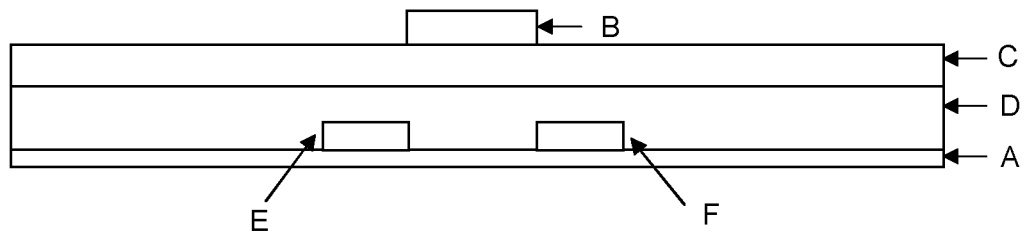
FIG. 4 is a representation a top gate/bottom contact (TG/BC) (OTFT

Labels—A: Substrate; B: Gate electrode; C: Dielectric layer; D: Semiconductor layer; E: Source electrode; F: Gate electrode

EXAMPLES OF THE PRESENT INVENTION

The following examples of the present invention are merely exemplary and should not be viewed as limiting the scope of the invention Measurement of the Permittivity (Capacitance) of the Polymer Binder Arrays of 36 capacitors, complete with guard-ring, were fabricated on glass substrates. Errors in measurement from fringing and stray capacitances at the edge of the electrode were virtually eliminated by the guard-ring (see ASTM D150).

Bottom contacts (including the guard-ring) were patterned by conventional photolithography and wet etch of sputtered 5 nm Ti and 50 nm Au layers. The area of each capacitor, 0.1257 cm$^2$, is determined by the radius of the guarded electrode. Polymer binders were spin-coated (500 rpm for 20 seconds) from 5% wt solutions in toluene and subsequently dried on a hotplate for 2 minutes at 100° C. to provide layers at least 250 nm thick. The exact thickness of the polymer binder layer was measured using both a Dektak 150 profilometer and Dimension V NanoMan AFM (both Veeco, Plainview N.Y.) at points adjacent to each capacitor. These measurements were performed after measuring the sample capacitance. 50 nm thick top contacts were defined by thermal evaporation of Al through a shadow mask.

Capacitance measurements were performed by applying a sinusoidal voltage (100 mV$_{p-p}$) at a frequency of 1 kHz to the sample using an Agilent 4284A precision LCR meter and probe station. The samples being measured were placed in a screened light-proof box to ensure minimum influence from the external environment.

Prior to each set of measurements, the LCR meter was compensated for the capacitances of the meter and test fixture using open and short circuit routines. The relative permittivity of the binder was determined from the measurements using the relation:

$C = \varepsilon \times \varepsilon_0 \times (A/d)$.

Wherein C is the sample capacitance (Farads), A is the area (m$^2$), d is the coating thickness (m), $\varepsilon$ is the relative permittivity, and $\varepsilon_0$ the permittivity of free space and is taken as 8.8854×10$^{-12}$ F/m.

As a reference sample, a polystyrene sample (Mw~350,000) having a thickness of 1 µm was tested. The measured and calculated dielectric constant of the polystyrene reference was $\varepsilon$=2.55 at 10,000 Hz, which is in good agreement with the reported value ($\varepsilon$~2.5), refer to J. R. Wunsch, Polystyrene-Synthesis, Production and Applications, *Rapra Review Reports*, 2000, Volume 10, No. 4, page 32.

Fabrication Method for Top Gate/Bottom Contact (TGBC) OTFTs

PEN substrates, laminated on to glass carriers, are sputter coated with 5 nm Ti and 50 nm Au layers. The metal layers were patterned using photolithography and chemical etch processes to form source/drain electrodes with channel lengths from 4 µm to 100 µm and widths from 500 µm to 15 mm. Substrates were placed in a bath of DMSO to remove the photoresist and were then rinsed in ultra pure water. After drying in a stream of nitrogen, the substrates were dried on a hotplate at 110° C. for 30 minutes.

After cooling, the Au electrodes were immersed in a 10 mM solution of pentafluorobenzenethiol in iso-propanol. After 1 minute excess solution was removed by spinning the substrate at 1000 rpm for 60 seconds. The substrate was then immediately spin-rinsed using pure iso-propanol and subsequently dried on a hotplate set to 100° C. for 60 seconds. Upon cooling the OSC solution was dispensed on to the substrate through a syringe fitted with a 0.45 µm filter and spin coated at 1500 rpm using a Suss RC-8 spinner. Any remaining solvent was removed by baking the substrate on a hotplate at 100° C. for 60 seconds. A 500 nm thick gate insulator was formed by spin-coating a solution of Cytop CTL809M (diluted to 6% solids in CT-SOLV 180; both supplied by Asahi Glass) at 1500 rpm and drying on a hotplate at 100° C. for 60 seconds. Gate electrodes were defined by thermal evaporation of Al through a shadow mask.

The electrical performance of the OSC formulation was characterised by placing on samples on a manual probe station connected to a Keithley SCS 4200 semiconductor analyzer. Drain current (I$_{DS}$) is measured in the linear regime with the drain voltage (V$_{DS}$) set to −2V and sweeping the gate voltage (V$_G$) between +20V and −40V. Mobility can then be calculated from the transconductance.

In linear regime, when |V$_G$|>|V$_{DS}$|, the source-drain current varies linearly with V$_G$. Thus the field effect mobility (µ) can be calculated from the gradient (S) of I$_{DS}$ vs. V$_G$ given by equation 1 (where C$_i$ is the capacitance per unit area, W is the channel width and L is the channel length):

$$S = \frac{\mu W C_i V_{DS}}{L} \qquad \text{Equation 1}$$

Fabrication Method for Bottom Gate/Bottom Contact (BGBC) OTFTs Using SU8 as the Gate Insulator 50 mm square glass substrates were cleaned by sonication in Decon 90 (1% in ultra pure water) for 10 minutes, rinsing in ultrapure water and then dried in a stream of nitrogen. After sputter coating a 5 nm Ti adhesion layer and 50 nm Au, the gate electrodes were defined using standard photolithography and wet etch processes. Photoresist was stripped by near-UV exposure and spin developing. SU8 2002 (supplied by Microchem), diluted to 45% by volume with EC Solvent (supplied by Microposit), was spin coated at 1200 rpm to produce a 490 nm thick insulating layer. Prior to UV exposure the SU8 was soft-baked at 95° C. for 1 minute. The SU8 was patterned with by exposing the layer through a shadow mask. After the post exposure bake (95° C. for 1 minute) the SU8 was developed in a bath of EC Solvent, rinsed with isopropanol and subsequently hard baked at 150° C. for 30 minutes on a hotplate.

After deposition and patterning of the SU8 insulator 50 nm Au was sputter coated and patterned to using standard photolithography and wet etching to provide source drain electrodes. Photoresist was removed by near-UV exposure and spin-developing as for the gate layer. TFT channel lengths of 5 µm, 10 µm, 30 µm, 100 µm with widths of 100 µm, 500 µm, 1 mm, 3 mm and 10 mm, were patterned with standard, interdigitated and corbino geometries.

Prior to spin-coating the OSC layer, the Au electrodes were conditioned in an oxygen plasma (RF power 250 W for 3 minutes) and coated with a 10 mM solution of pentaflourobenzenethiol in isopropanol. After 1 minute the solution was removed by spinning at 1000 rpm for 30 seconds and then rinsed with isopropanol and dried on a hotplate as for the TGBC TFTs.

The OSC solution was deposited through a syringe fitted with a 0.45 µm filter, spin-coated at a final speed of 2000 rpm for 1 minute on a Laurel spinner and then baked at 100° C. for 1 minute.

Devices were encapsulated by spin depositing a layer of Cytop CTL809M (Asahi Glass) diluted to 6% with CT-Solv 180 at 1500 rpm and drying on a hotplate at 100° C. for 1 minute.

Mobility in the linear regime was calculated from the slope of the transfer characteristic (using equation 1) obtained by sweeping the gate with voltages between +80V and −40V at a drain voltage of −2V Fabrication Method for Bottom Gate/Bottom Contact (BGBC) TFTs Using $SiO_2$ as the Gate Insulator 15 mm square patterned substrates were purchased from Fraunhofer IPMS. Each substrate included an array of 16 TFTs with Au source drain electrodes having channel lengths of 2.5 µm, 5 µm, 10 µm and 20 µm. All of the said TFTs had a channel width of 2 mm. The gate was N-doped silicon with a 230 nm thick oxide as the gate insulator.

A protective layer of photoresist was removed by soaking and rinsing in acetone. Prior to any coating the substrates were placed in an oxygen plasma (250 W) for 5 minutes. The gate insulator layer was treated by flooding the substrate with a 25 mM solution of phenethyltrichlorosilane in toluene (filtered through a 0.45 µm filter) and leaving for 2 minutes. The solution was removed by spin-coating at 1000 rpm for 30 seconds. HCl produced by the silanization process is removed by dispensing toluene onto the substrate through a 0.45 µm filter, leaving for 5 seconds and then spin coating at 1000 rpm for 30 seconds whilst dispensing fresh toluene. The substrate is dried by continuing the spin cycle for a further 30 seconds and then baking on a hotplate at 100° C. for 1 minute. After cooling, a solution of 10 mM pentafluorobenzenethiol in isopropanol is deposited through a 0.45 µm filter to form a self assembled monolayer on the Au source drain contacts. Deposition is as described previously for TGBC and SU8 samples.

The OSC solution was dispensed on to the substrate through a 0.45 µm filter and spin-coating at 2000 rpm for 1 minute and dried on a hotplate for 1 minute at 100° C. Devices were then encapsulated with Cytop CTL-809M (dilute to 6% in CT-SOLV 180) by spin-coating at 1500 rpm for 20 seconds and baking for 1 minute on a hotplate set to 100° C.

Method to Determine Molecular Weight and Molecular Weight Distribution of the PAHC Gel Permeation Chromatography (GPC) analysis was carried out on a Waters Alliance 2695 instrument along with a Waters 2414 refractive index (RI) detector, using an Agilent PL gel 5 µm Mixed-D 300×7.5 mm column eluting with tetrahydrofuran. Calibration was performed using Agilent "EasiVial" polystyrene standards (PL2010-0400).

EXAMPLES OF THE PRESENT INVENTION

The following examples are intended to explain the invention without restricting it. The methods, structures and properties described herein can also be applied to materials that are claimed in this invention but not explicitly described in the examples.

Particularly preferred PAHCs according to the present invention are shown in the following Table 1:

TABLE 1

Preferred PAHCs

Monomer A

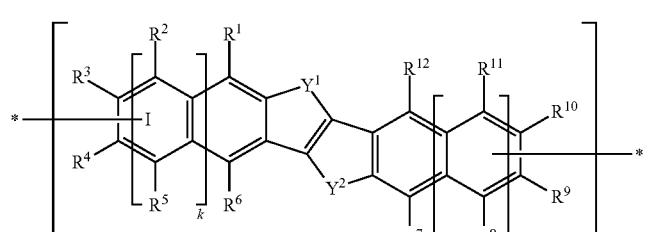

| Example | |
|---|---|
| 1 | Case 1<br>$Y^1 = Y^2$ are S; k = 0; l = 0.<br>$R^1, R^2, R^5, R^6, R^7, R^8, R^{11}, R^{12}$ are all H.<br>$R^4$ and $R^{10}$ are $C_1$ to $C_{14}$ alkyl groups, most preferably n-octyl groups.<br>$R^3$ and, $R^9$ are bonds to another unit of Monomer (A), (B) or (C). |
| 2 | Case 2<br>$Y^1 = Y^2$ are S; k = 0; l = 0.<br>$R^1, R^2, R^5, R^6, R^7, R^8, R^{11}, R^{12}$ are all H.<br>$R^3$ and $R^9$ are $C_1$ to $C_{14}$ alkyl groups, most preferably n-octyl groups.<br>$R^4$ and $R^{10}$ are bonds to another unit of Monomer (A), (B) or (C). |
| 3 | Case 3<br>$Y^1 = Y^2$ are S; k = 0; l = 0.<br>$R^1, R^2, R^5, R^6, R^7, R^8, R^{11}, R^{12}$ are all H. |

TABLE 1-continued

|  |  |
|---|---|
|  | $R^4$ and $R^{10}$ are $CF_3$ groups. |
|  | $R^3$ and $R^9$ are bonds to another unit of Monomer (A), (B) or (C). |
| 4 | Case 4 |
|  | $Y^1 = Y^2$ are S; k = 0; l = 0. |
|  | $R^1, R^2, R^5, R^6, R^7, R^8, R^{11}, R^{12}$ are all H. |
|  | $R^3$ and, $R^9$ are $CF_3$ groups. |
|  | $R^4$ and $R^{10}$ are bonds to another unit of Monomer (A), (B) or (C). |
| 5 | Case 1 |
| 6 | Case 2 |
| 7 | Case 3 |
| 8 | Case 4 |
| 9 | Case 1 |
| 10 | Case 2 |
| 11 | Case 3 |
| 12 | Case 4 |
| 13 | Case 1 |
| 14 | Case 2 |
| 15 | Case 3 |
| 16 | Case 4 |
| 17 | Case 1 |
| 18 | Case 2 |
| 19 | Case 3 |
| 20 | Case 4 |
| 21 | Case 1 |
| 22 | Case 2 |
| 23 | Case 3 |
| 24 | Case 4 |
| 25 | Case 1 |
| 26 | Case 2 |
| 27 | Case 3 |
| 28 | Case 4 |
| 29 | Case 1 |
| 30 | Case 2 |
| 31 | Case 3 |
| 32 | Case 4 |
| 33 | Case 1 |
| 34 | Case 2 |
| 35 | Case 3 |
| 36 | Case 4 |
| 37 | Case 1 |
| 38 | Case 2 |
| 38 | Case 3 |
| 40 | Case 4 |
| 41 | Case 1 |
| 42 | Case 2 |
| 43 | Case 3 |
| 44 | Case 4 |

Preferred PAHCs

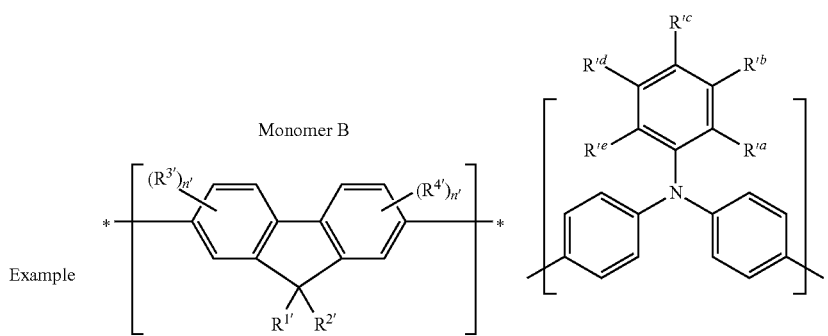

| Example | Monomer B | Monomer C |
|---|---|---|
| 1 | $R^{1'} = R^{2'} = C_1$ to $C_{14}$ alkyl group, preferably n-octyl groups. | $R^{1a}, R^{1b}, R^{1c}, R^{1d}, R^{1e}$ = H. |
| 2 |  |  |
| 3 |  |  |
| 4 | $R^{3'}, R^{4'}$ = H or $C_1$ to $C_4$ alkyl groups; or $C_1$ to $C_4$ alkoxy groups; or cyano groups; or isopropyl cyano groups. |  |
| 5 | $R^{1'} = R^{2'} = C_1$ to $C_{14}$ alkyl group, preferably n-octyl groups. | $R^{1b}, R^{1d}, R^{1e}$ = H. |
| 6 |  | $R^{1a}$ and $R^{1c} = C_1$ to $C_4$ alkyl. |
| 7 |  |  |

TABLE 1-continued

| | | |
|---|---|---|
| 8 | $R^{3'}, R^{4'}$ = H or $C_1$ to $C_4$ alkyl groups; or $C_1$ to $C_4$ alkoxy groups; or cyano groups; or isopropyl cyano groups. | |
| 9 | $R^{1'} = R^{2'} = C_1$ to $C_{14}$ alkyl | $R^{'b}, R^{'c}, R^{'d}, R^{'e}$ = H. |
| 10 | group, preferably n-octyl | $R^{'a} = C_1$ to $C_6$ alkoxy. |
| 11 | groups. | (i) $R^{'a}$ = methoxy |
| 12 | $R^{3'}, R^{4'}$ = H or $C_1$ to $C_4$ alkyl groups; or $C_1$ to $C_4$ alkoxy groups; or cyano groups; or isopropyl cyano groups. | (ii) $R^{'a}$ = ethoxy |
| 13 | $R^{1'} = R^{2'} = C_1$ to $C_{14}$ alkyl | $R^{'a}, R^{'b}, R^{'d}, R^{'e}$ = H. |
| 14 | group, preferably n-octyl | $R^{'c} = C_1$ to $C_6$ alkoxy. |
| 15 | groups. | (i) $R^{'c}$ = methoxy |
| 16 | $R^{3'}, R^{4'}$ = H or $C_1$ to $C_4$ alkyl groups; or $C_1$ to $C_4$ alkoxy groups; or cyano groups; or isopropyl cyano groups. | (ii) $R^{'c}$ = ethoxy |
| 17 | $R^{1'} = R^{2'} = C_1$ to $C_{14}$ alkyl | $R^{'a}, R^{'b}, R^{'c}, R^{'d}$ = H. |
| 18 | group, preferably n-octyl | $R^{'e} = C_1$ to $C_6$ alkoxy. |
| 19 | groups. | (i) $R^{'e}$ = methoxy |
| 20 | $R^{3'}, R^{4'}$ = H or $C_1$ to $C_4$ alkyl groups; or $C_1$ to $C_4$ alkoxy groups; or cyano groups; or isopropyl cyano groups. | (ii) $R^{'e}$ = ethoxy |
| 21 | $R^{1'} = R^{2'} = C_1$ to $C_{14}$ alkyl | $R^{'b}, R^{'d}, R^{'e}$ = H. |
| 22 | group, preferably n-octyl | $R^{'a} = R^{'c} = C_1$ to $C_6$ alkoxy. |
| 23 | groups. | (i) $R^{'a} = R^{'c}$ = methoxy |
| 24 | $R^{3'}, R^{4'}$ = H or $C_1$ to $C_4$ alkyl groups; or $C_1$ to $C_4$ alkoxy groups; or cyano groups; or isopropyl cyano groups. | (ii) $R^{'a} = R^{'c}$ = ethoxy |
| 25 | $R^{1'} = R^{2'} = C_1$ to $C_{14}$ alkyl | $R^{'b}, R^{'d}$ = H |
| 26 | group, preferably n-octyl | $R^{'a}, R^{'c}, R^{'e} = C_1$ to $C_6$ alkoxy |
| 27 | groups. | (i) $R^{'a}, R^{'c}, R^{'e}$ = methoxy |
| 28 | $R^{3'}, R^{4'}$ = H or $C_1$ to $C_4$ alkyl groups; or $C_1$ to $C_4$ alkoxy groups; or cyano groups; or isopropyl cyano groups. | (ii) $R^{'a}, R^{'c}, R^{'e}$ = ethoxy |
| 29 | $R^{1'} = R^{2'} = C_1$ to $C_{14}$ alkyl | $R^{'b}, R^{'d}$ = H. |
| 30 | group, preferably n-octyl | $R^{'b}, R^{'c}, R^{'d} = C_1$ to $C_6$ alkoxy. |
| 31 | groups. | (i) $R^{'b}, R^{'c}, R^{'d}$ = methoxy |
| 32 | $R^{3'}, R^{4'}$ = H or $C_1$ to $C_4$ alkyl groups; or $C_1$ to $C_4$ alkoxy groups; or cyano groups; or isopropyl cyano groups. | (ii) $R^{'b}, R^{'c}, R^{'d}$ = ethoxy |
| 33 | $R^{1'} = R^{2'} = C_1$ to $C_{14}$ alkyl | $R^{'b}, R^{'c}, R^{'d}, R^{'e}$ = H. |
| 34 | group, preferably n-octyl | $R^{'a}$ = Cyano (CN). |
| 35 | groups. | |
| 36 | $R^{3'}, R^{4'}$ = H or $C_1$ to $C_4$ alkyl groups; or $C_1$ to $C_4$ alkoxy groups; or cyano groups; or isopropyl cyano groups. | |
| 37 | $R^{1'} = R^{2'} = C_1$ to $C_{14}$ alkyl | $R^{'b}, R^{'c}, R^{'d}, R^{'e}$ = H. |
| 38 | group, preferably n-octyl | $R^{'a}$ = Isopropylcyano group shown |
| 38 | groups. | below as Monomer (1) |
| 40 | $R^{3'}, R^{4'}$ = H or $C_1$ to $C_4$ alkyl groups; or $C_1$ to $C_4$ alkoxy groups; or cyano groups; or isopropyl cyano groups. | Monomer (1): 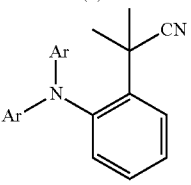 |
| 41 | $R^{1'} = R^{2'} = C_1$ to $C_{14}$ alkyl | $R^{'a}, R^{'b}, R^{'d}, R^{'e}$ = H. |
| 42 | group, preferably n-octyl | $R^{'c}$ = Isopropylcyano group. |
| 43 | groups. | Monomer 1: |

| 44 | R³', R⁴' = H or $C_1$ to $C_4$ alkyl groups; or $C_1$ to $C_4$ alkoxy groups; or cyano groups; or isopropyl cyano groups. | 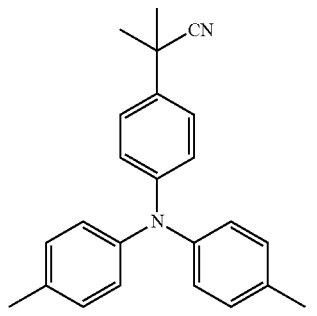 |

Compound (1)

Preparation of 4,4'-dibromostilbene-2,2'-disulfonic acid dipotassium salt

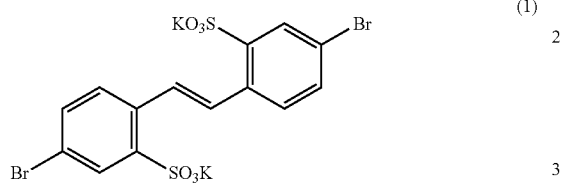

Compound (2)

Preparation of 4,4'-dibromostilbene-2,2'-disulfonyl chloride

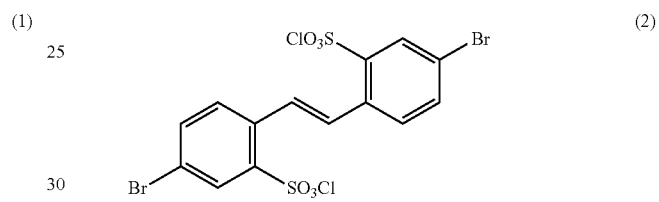

4,4'-Diaminostilbene-2,2'-disulfonic acid (TCI Europe D0120) was added to a beaker containing water (400 mL). 40% HBr (125 mL) was then added and the mixture cooled to 0 deg C. using an ice/salt bath. A solution of sodium nitrite (23.74 g in 100 mL of water) was added over 40 min. The mixture was stirred for 1 h. A further amount of sodium nitrite solution (0.5 g in 0.5 mL water) was then added and an excess of nitrous acid detected using starch-iodide paper. The mixture was then stirred for a further 2 h, then urea (1 g) was added to destroy excess nitrous acid (starch-iodide paper). The beaker was then cooled in a refrigerator overnight. The supernatant liquid was then decanted and the precipitated diazonium salt added portionwise as a slurry to a solution of CuBr (63.5 g) in 40% HBr (350 mL) at 70 deg C. After completion of addition the mixture was cooled to <5 deg C. The solid was collected by filtration using a Buchner funnel (Whatman GF/F paper). The wet solid was then dissolved in water (700 mL) with heating (~70 deg C.). The mixture was filtered. Potassium carbonate was then added to the filtrate until the pH of the solution was approx. pH 10. A green precipitate was removed by filtration and the filtrate concentrated in vacuo. Solid material began to precipitate after approx. 400 mL of water had been removed. The mixture was reheated to 70 deg C. and refiltered to remove precipitated green solid. The mixture was then concentrated in vacuo to remove a further 100 mL of water. The solution was then cooled to ~5 deg C. for 1 h. The product was isolated as a pale yellow solid by filtration (44.86 g). A further two crops of material were obtained (13.56 g, total mass=58.42 g, 60%). 1H NMR (500 MHz, d6-DMSO) 8.07 (2H, s), 7.92 (2H, s), 7.59-7.54 (4H, m).

Dimethylformamide (2.5 mL) was added to a mixture of 4,4'-dibromostilbene-2,2'-disulfonic acid dipotassium salt (25 g, 43.5 mmol) and thionyl chloride (Sigma-Aldrich 320536, 260 mL) under nitrogen. The mixture was then heated to reflux for 3 h. The mixture was then allowed to cool to room temperature. The thionyl chloride was then removed in vacuo. Toluene (50 mL) was added and the mixture concentrated in vacuo to remove any residual thionyl chloride. The solid residue was then dissolved in DCM (600 mL) and purified by dry column chromatography (eluent: DCM). The fractions obtained were then concentrated. The solid obtained was then stirred with DCM (200 mL) and collected by filtration. The filter cake was washed with diethyl ether (20 mL) and dried in a vacuum oven at 40 deg C. overnight to give the product as a pale yellow solid (3.45 g). A second crop of product was obtained from the DCM filtrate (3.45 g, total mass=15.79 g, 68%). 1H NMR (500 MHz, CDCl₃) 8.27 (2H, s) 7.96-7.85 (4H, m), 7.88 (2H, d, J=8.34 Hz).

Compound (3)

Preparation of 2,7-dibromo[1]benzothieno[3,2-b][1]benzothiophene

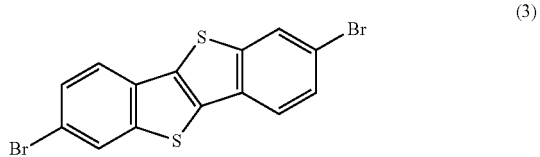 [SMILES: Brc1ccc2c(c1)sc1c3ccc(Br)cc3sc21]

A stirred suspension of 4,4'-dibromostilbene-2,2'-disulfonyl chloride (6.0 g, 11.2 mmol) in glacial acetic acid (625 mL) was heated to 100 deg C. 55% HI (Sigma-Aldrich 398098, 63 mL) was then added and heating continued for a further 10 min. The mixture was allowed to cool with stirring overnight. The precipitated solid was collected by filtration and washed with 20% NaHSO₃ (200 mL) and water (200 mL) to give a mixture of products (2.29 g) which were taken on to the next stage without further purification. The mixture of products obtained were added to glacial acetic acid (100 mL) and heated to reflux. Pyridium tribromide (Sigma-Aldrich 1332481, 6.0 g, 16.0 mmol) was added and the mixture held at reflux for 3 h. The reaction mixture was then allowed to cool to room temperature. The precipitated solid was collected by filtration, washed with acetic acid (20 mL) and diethyl ether (2×20 mL) and dried in a vacuum oven overnight (2.08 g). The crude product was then purified by recrystallization from toluene (260 mL) to give the product as colourless needles (1.86 g, 42% yield based on the starting disulfonyl chloride). 1H NMR (300 MHz, d8-THF) 8.19 (2H, d, J=1.35 Hz), 7.83 (2H, d, J=8.52 Hz), 7.60 (2H, dd, J=8.52 Hz, 1.35 Hz).

Compound (4)

2,7-Bis[(4,4,5,5-tetramethyl-1,3,2-dioxaborolan-2-yl)]-9,9-di-n-octylfluorene

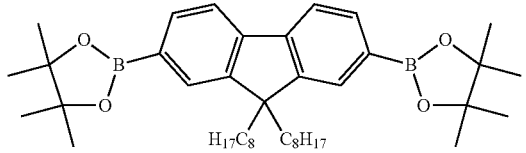

2,7-Dibromo-9,9-di-n-octylfluorene (5.00 g, 9.12 mmol, 1 eq) in THF (20 mL) was stirred at −75 deg C. under N₂. n-Butyllithium (Acros 10030462, 2.5M solution in hexanes, 8.75 mL, 21.9 mmol, 2.4 eq) was added dropwise. The reaction mixture was allowed to stir at −75 deg C. for 1 hour, then 2-isopropoxy-4,4,5,5-tetramethyl-1,3,2-dioxaborolane (Sigma-Aldrich 417149, 4.41 g, 23.71 mmol, 2.6 eq) was added. The reaction mixture was then allowed to warm to room temperature with stirring overnight. Water (30 mL) and DCM (60 mL) were added, the organic layer was separated and the aqueous extracted with DCM (3×30 mL). The combined organic extracts were dried over MgSO₄, filtered and concentrated in vacuo to give a colourless solid (5.62 g). The product was purified by dry column chromatography (gradient elution: 20%-50% DCM:heptane) to give the product (7) as a colourless solid (4.20 g, 6.54 mmol, 71%). ¹H NMR (500 MHz, CDCl₃) 7.82-7.70 (6H, m), 2.01-1.97 (4H, m), 1.39 (24H, s), 1.20-1.01 (20H, m), 0.81 (6H, t, J=7.1 Hz), 0.55-0.53 (4H, m).

Compound (5)

Preparation of 4-iodophenylacetonitrile

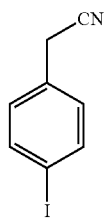

4-bromophenylacetonitrile (Apollo Scientific OR017366, 50.01 g, 255 mmol), sodium iodide (Sigma-Aldrich 217638, 76.75 g, 512 mmol) and copper iodide (Sigma-Aldrich 03140, 2.44 g, 12.8 mmol) were added to a 250 mL flask. N,N'-Dimethylethyldiamine (Sigma-Aldrich D157805, 2.8 mL, 26 mmol) and dioxane (50 mL) were added and the mixture was heated to reflux with stirring overnight. The reaction mixture was then allowed to cool and was poured into 30% aq. NH₃ (Sigma-Aldrich 221228, 250 mL). The mixture was then poured into water (1 L) and extracted with dichloromethane (3×100 mL). The combined extracts were dried over MgSO₄, filtered and concentrated in vacuo to give a pale brown solid (58.88 g, 95%). ¹H NMR (500 MHz, CDCl₃) 7.64 (2H, d, J=8.2 Hz), 7.01 (2H, d, J-8.2 Hz), 3.62 (2H, s, C$\underline{H}$₂CN). MS (APGC) m/z 244 (MH⁺, 100%).

Compound (6)

Preparation of 2-(4-iodophenyl)-2-methylpropanenitrile

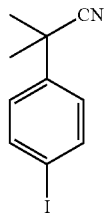

A 500 mL round bottomed flask was charged with sodium tert-butoxide (Sigma-Aldrich 359270, 76.0 g, 791 mmol) in THF (120 mL). The mixture was cooled to 0 deg C. using an ice-water bath. N-Methylpyrrolidinone (NMP, Sigma-Aldrich 443778, 120 mL) was then added. A solution of 4-iodophenylacetonitrile (48.10 g, 198 mmol) and methyl iodide (Sigma-Aldrich 18507, 49 mL, 787 mmol) in 1:1 THF:NMP (106 mL) was added slowly to the reaction mixture so as to keep the temperature below 10 deg C. On completion of addition the mixture was allowed to warm to room temperature and stirred overnight. 3M HCl was then added (580 ml) and the mixture extracted with toluene (3×250 mL). The combined extracts were washed with saturated aqueous sodium carbonate solution (580 mL), brine (580 mL) and saturated aqueous sodium thiosulfate solution (580 mL). The organic layer was then dried over MgSO₄, filtered and concentrated in vacuo to give a brown oil. Purification by dry column chromatography (gradient elution: heptane-20% ethyl actate:heptane) gave the product as a pale yellow oil which solidified on standing (46.60 g, 172 mmol, 87%). $^1$H NMR (500 MHz, CDCl$_3$) 7.72 (2H, d, J=8.7 Hz), 7.22 (2H, d, J=8.7 Hz), 1.70 (6H, s, C(C$\underline{H}_3$)$_2$CN).

Compound (7)

Preparation of 2-(4-(diphenylamino)phenyl)-2-methylpropanenitrile

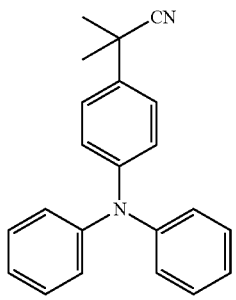 [SMILES: CC(C)(C#N)c1ccc(N(c2ccccc2)c2ccccc2)cc1]

Palladium (II) actate (Sigma-Aldrich 520764, 3.02 g, 13.45 mmol) and 4,5-bis(diphenylphosphino)-9,9-dimethylxanthene (Xantphos, Sigma-Aldrich 526460) (7.76 g, 13.4 mmol) were dissolved in toluene (550 mL). The solution was then degassed by passing a stream of nitrogen through for 20 minutes. Diphenylamine (Sigma-Aldrich 242586, 22.74 g, 134 mmol), sodium tert-butoxide (Sigma-Aldrich 359270, 28.39 g, 295 mmol) and 2-(4-iodophenyl)-2-methylpropanenitrile (40.02 g, 148 mmol) were added. The reaction mixture was then heated to 90 deg C. and stirred at this temperature overnight. The reaction mixture was then allowed to cool and was filtered through a pad of celite. The filtrate was washed with water and brine. The solution was then dried over MgSO$_4$, filtered and concentrated in vacuo to give a brown oil. Heptane was added and the precipitated solid collected by filtration to give the product as an off white solid (15.86 g). A further crop was isolated by refiltering the filtrate after standing to give a pale yellow solid (12.41 g, total mass=28.27 g, 90.6 mmol, 61%). This material was identical to the first crop by NMR spectroscopy. $^1$H NMR (500 MHz, CDCl$_3$) 7.31-7.24 (6H, m), 7.10-7.04 (8H, m), 1.71 (6H, s, C(C$\underline{H}_3$)$_2$CN).

Compound (8)

Preparation of 2-(4-(bis(4-bromophenyl)amino)phenyl)-2-methylpropanenitrile

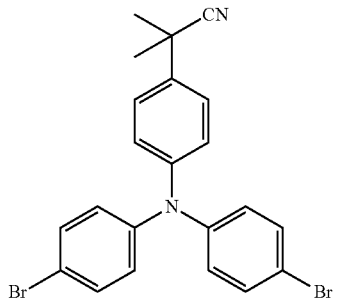 [SMILES: CC(C)(C#N)c1ccc(N(c2ccc(Br)cc2)c2ccc(Br)cc2)cc1]

2-(4-(diphenylamino)phenyl)-2-methylpropanenitrile (10.05 g, 32.2 mmol) was dissolved in ethyl acetate (175 mL). N-bromosuccinimide (NBS, Sigma-Aldrich B81255) (11.48 g, 64.5 mmol) was added portionwise and the mixture was then allowed to stir overnight. The reaction mixture was then washed with water, sodium carbonate and brine. The solution was then dried over MgSO4, filtered and concentrated in vacuo to give a pale yellow oil (15.78 g). This was purified by dry column chromatography (gradient elution 5% ethyl acetate: heptane-20% ethyl acetate:heptane) to give the product (8) as a pale yellow foam (14.21 g, 30.2 mol, 94%). $^1$H NMR (500 MHz, CDCl$_3$) 7.36 (4H, d, J=6.8 Hz), 7.34 (2H, d, J=8.7 Hz), 7.04 (2H, d, J=8.7 Hz), 6.93 (4H, d, J=6.8 Hz), 1.72 (6H, s, C(C$\underline{H}_3$)$_2$CN).

Formulation (1)

PAHC (1): BTBT: 9,9-di-n-octylfluorene: 2-(diphenylamino)-2-methylpropanenitrile copolymer A mixture of 2,7-dibromo[1]benzothieno[3,2-b][1]benzothiophene (3) (0.40 g, 1.00 mmol, 0.5 eq), 2-(4-(bis(4-bromophenyl)amino)phenyl)-2-methylpropanenitrile (8) (0.47 g, 1.0 mmol, 0.5 eq), 2,7-bis[(4,4,5,5-tetramethyl-1,3,2-dioxaborolan-2-yl)]-9,9-di-n-octylfluorene (4) (1.29 g, 2.0 mmol, 1 eq) tetrakis(triphenylphosphine)palladium (0) (Acros 44140005, 0.069 g, 0.03 mmol, 0.03 eq), 2M K$_2$CO$_3$ (Sigma-Aldrich 209619, 6.0 mL, 12.0 mmol, 6 eq) and Aliquat® 336 (Sigma-Aldrich 205613, 4 drops) in toluene (81 mL) was degassed by passing a stream of nitrogen through the solution for 1 h. The mixture was then heated to reflux. After 2 h HPLC confirmed the presence of oligomers. The reaction mixture was allowed to cool to 50 deg C. The reaction mixture was poured into MeOH (250 mL) with stirring. After 30 minutes the precipitated solid was collected by filtration under suction using a Buchner funnel to give a yellow solid (1.33 g) which was purified by dry column chromatography (eluent: THF) to give an orange solid (1.03 g). The solid was purified again by flash column chromatography (eluent: THF). The fractions containing the product were concentrated in vacuo to give a yellow-orange solid (1.00 g). The solid was dissolved in THF (50 mL) and poured into methanol (150 mL). The precipitated solid was collected by filtration under suction using a Buchner funnel. The solid obtained was then dried in a vacuum oven to give the product as a pale brown powder (0.80 g), which was characterised as follows: GPC M$_n$=4103 Daltons, N$_{av}$=13. The permittivity of PAHC (1) was 3.51.

The invention claimed is:

1. A Polycyclic Aromatic Hydrocarbon random Copolymer (PAHC) comprising a coplymer of at least one benzochalcogenophenobenzochalogenophene (BXBX) monomer unit having the Formula (A), and at least one fluorene monomer unit having the Formula (B), and at least one triarylamine monomer unit having the Formula (C):

Formula (A)

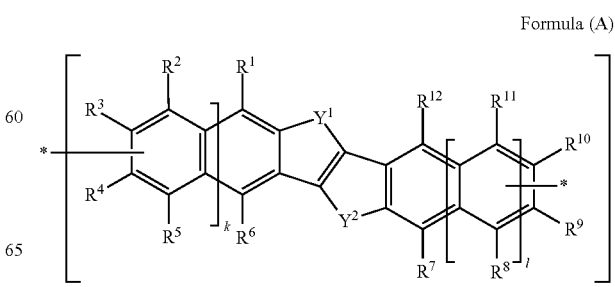

-continued

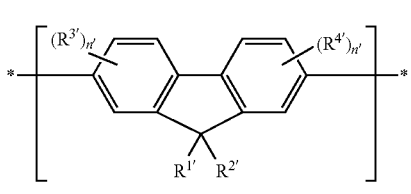

Formula (B)

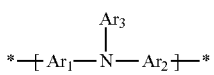

Formula (C)

wherein,
Y¹ and Y² are independently S or Se; k is 0 or 1; l is 0 or 1; n' is 0, 1, 2 or 3;
wherein each of $R^1$, $R^2$, $R^3$, $R^4$, $R^5$, $R^6$, $R^7$, $R^8$, $R^9$, $R^{10}$, $R^{11}$, $R^{12}$, which may be the same or different, independently represents hydrogen; a branched or unbranched, substituted or unsubstituted $C_1$-$C_{40}$ alkyl group; a branched or unbranched, substituted or unsubstituted $C_2$-$C_{40}$ alkenyl group; a branched or unbranched, substituted or unsubstituted $C_2$-$C_{40}$ alkynyl group; an optionally substituted $C_3$-$C_{40}$ cycloalkyl group; an optionally substituted $C_6$-$C_{40}$ aryl group; an optionally substituted $C_1$-$C_{40}$ heterocyclic group; an optionally substituted $C_1$-$C_{40}$ heteroaryl group; an optionally substituted $C_1$-$C_{40}$ alkoxy group; an optionally substituted $C_6$-$C_{40}$ aryloxy group; an optionally substituted $C_7$-$C_{40}$ alkylaryloxy group; an optionally substituted $C_2$-$C_{40}$ alkoxycarbonyl group; an optionally substituted $C_7$-$C_{40}$ aryloxycarbonyl group; a cyano group (—CN); a carbamoyl group (—C(=O)NR$^{15}$R$^{16}$); a carbonyl group (—C(=O)—R$^{17}$); a carboxyl group (—CO$_2$R$^{18}$) a cyanate group (—OCN); an isocyano group (—NC); an isocyanate group (—NCO); a thiocyanate group (—SCN) or a thioisocyanate group (—NCS); an optionally substituted amino group; a hydroxy group; a nitro group; a CF$_3$ group; a halo group (Cl, Br, F, I); —SR$^{19}$; —SO$_3$H; —SO$_2$R$^{20}$; —SF$_5$; an optionally substituted silyl group;

wherein at least two of $R^1$, $R^3$, $R^4$, $R^6$, $R^7$, $R^9$, $R^{10}$, and $R^{12}$, are a bond, represented by ——*, to another monomer unit having the Formula (A), (B), or (C); and wherein each $R^{1'}$, $R^{2'}$, $R^{3'}$ and $R^{4'}$, each of which may be the same or different, is selected from the same group as $R^1$, $R^2$, $R^3$, $R^4$ already defined above for monomer (A) and for the monomer group (A), ——* represents a bond to another monomer unit having the Formula (A), (B) or (C)
wherein Ar$_1$, Ar$_2$ and Ar$_3$, which may be the same or different, each represent, independently, an optionally substituted $C_{6-40}$ aromatic group (mononuclear or polynuclear).

2. A PAHC according to claim 1, having the generalised structure of Formula (1)

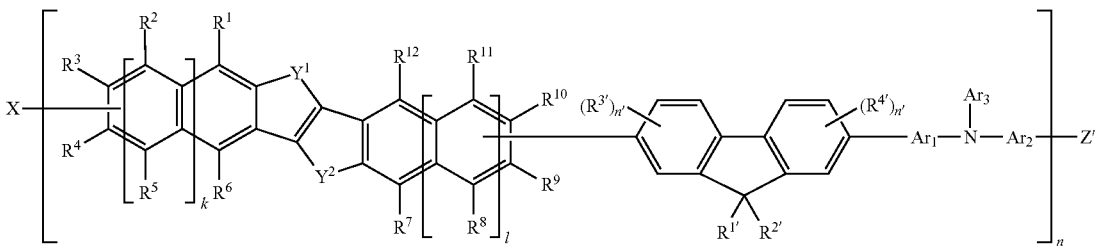

Formula (1)

wherein n is the number of repeat units in the polymer, and X' and Z' are independently selected from halogen groups or cyclic boronate groups.

3. A PAHC according to claim 1, comprising at least 10 wt. % (of the total of all monomer units (A), (B) and (C) in the copolymer or composition) of monomer unit (A), at least 40 wt. % of monomer unit (B), and at least 15 wt. %, of monomer unit (C).

4. A PAHC according to claim 1, wherein Ar$_1$, Ar$_2$ and Ar$_3$ are independently selected from the group consisting of an optionally substituted $C_{6-20}$ aromatic group (mononuclear or polynuclear), wherein at least one of Ar$_1$, Ar$_2$ and Ar$_3$ is substituted with one or more polar group.

5. A PAHC according to claim 4, wherein Ar$_1$, Ar$_2$ and Ar$_3$ are all phenyl, which may be independently substituted with 1 or 2 groups selected from the group consisting of methoxy, cyanoC$_{1-4}$ alkyl, CN, substituted cyano groups, and mixtures thereof.

6. A PAHC according to claim 1, further comprising one or more monomer units (D), (D') and/or (E):

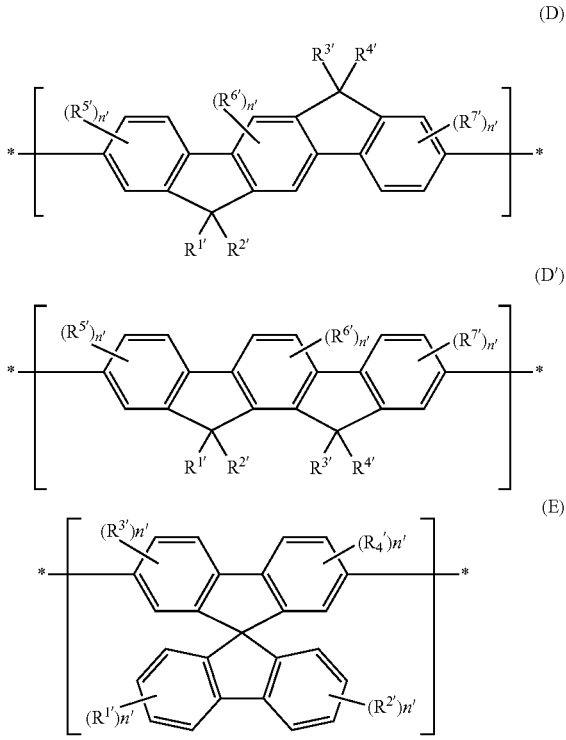

wherein each R¹', R²', R³', R⁴', R⁵', R⁶' and R⁷', each of which may be the same or different, is selected from the same group as R¹, R², R³, R⁴, R⁵, R⁶ and R⁷, as defined in claim 1;

wherein n'=1 to 3; and wherein monomer (A) is present in an amount of at least 10 wt. %; monomer (D), (D') and or (E) is present in an amount of 20-60 wt. %, and at least 15 wt. % of a monomer unit having the Formula (C).

7. A PAHC according to claim 6, wherein at least one of R¹', R²', R³', R⁴' is a polar group.

8. A PAHC according to claim 1, wherein k =1 =0 or 1.

9. A PAHC according to claim 1, wherein k =0 and 1=0.

10. A PAHC according to claim 1, wherein the copolymers have a number average molecular weight (Mn) of between 500 and 100000.

11. A PAHC according to claim 1, wherein the copolymers are semiconducting random copolymers having a permittivity at 1000 Hz of greater than 1.5.

12. A PAHC according to claim 1, wherein R¹,R³, R⁶, R⁷, R⁹ and R¹² are hydrogen.

13. A PAHC according to claim 1, wherein the one or more polar group(s) is independently selected from the group consisting of nitro group, nitrile group, $C_{1-40}$ alkyl group substituted with a nitro group, a nitrile group, a cyanate group, an isocyanate group, a thiocyanate group or a thioisocyanate group; $C_{1-40}$ alkoxy group optionally substituted with a nitro group, a nitrile group, a cyanate group, an isocyanate group, a thiocyanate group or a thioisocyanate group; $C_{1-40}$ carboxylic acid group optionally substituted with a nitro group, a nitrile group, a cyanate group, an isocyanate group, a thiocyanate group or a thioisocyanate group; $C_{2-40}$ carboxylic acid ester optionally substituted with a nitro group, a nitrile group, a cyanate group, an isocyanate group, a thiocyanate group or a thioisocyanate group; sulfonic acid optionally substituted with a nitro group, a nitrile group, a cyanate group, an isocyanate group, a thiocyanate group or a thioisocyanate group; sulfonic acid ester optionally substituted with a nitro group, a nitrile group, a cyanate group, an isocyanate group, a thiocyanate group or a thioisocyanate group; cyanate group, isocyanate group, thiocyanate group, thioisocyanate group; and an amino group optionally substituted with a nitro group, a nitrile group, a cyanate group, an isocyanate group, a thiocyanate group or a thioisocyanate group; and combinations thereof.

14. An organic semiconductor composition comprising a PAHC according to claim 1, further comprising a non-polymerised polycrystalline polyacene molecule, wherein the PAHC has a permittivity at 1000 Hz of between 3.4 and 8.0.

15. An organic semiconductor composition comprising a PAHC according to claim 1 and a non-polymerised BXBX molecule.

16. An organic semiconductor composition according to claim 14, wherein the composition has a permittivity at 1000 Hz of between 3 and 6.5.

17. An organic semiconductor composition according to claim 14, further comprising an organic binder, wherein the organic binder has a permittivity at 1000 Hz of between 3.4 and 8.

18. An organic semiconductor composition according to claim 14 having a charge mobility value of at least 0.5 $cm^2V^{-1}s^{-1}$.

19. An organic semiconductor layer, comprising a PAHC according to claim 1.

20. An electronic device comprising a PAHC according to claim 1.

21. An electronic device according to claim 20, selected from organic thin film transistors (OTFTs), organic light emitting diodes (OLEDS), photodetectors, organic photovoltaic (OPV) cells, sensors, lasers, memory elements and logic circuits.

22. An ink comprising a PAHC according to claim 1.

23. A process for producing a Polycyclic Aromatic Hydrocarbon random Copolymer (PAHC) comprising polymerising a composition containing at least one BXBX monomer selected from the structure A', at least one monomer selected from the Structure B' and at least one monomer selected from the structure C':

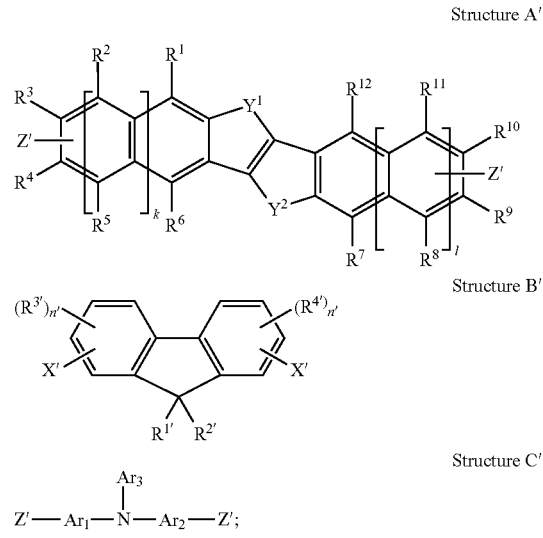

wherein $Y^1$ and $Y^2$ are independently S or Se; k is 0 or 1; 1 is 0 or 1; n' is 0,1, 2 or 3;

wherein each of $R^1$, $R^2$, $R^3$, $R^4$, $R^5$, $R^6$, $R^7$, $R^8$, $R^9$, $R^{10}$, $R^{11}$ and $R^{12}$, which may be the same or different, independently represents hydrogen; a branched or unbranched, substituted or unsubstituted $C_1$-$C_{40}$ alkyl group; a branched or unbranched, substituted or unsubstituted $C_2$-$C_{40}$ alkenyl group; a branched or unbranched, substituted or unsubstituted $C_2$-$C_{40}$ alkynyl group; an optionally substituted $C_3$-$C_{40}$ cycloalkyl group; an optionally substituted $C_6$-$C_{40}$ aryl group; an optionally substituted $C_1$-$C_{40}$ heterocyclic group; an optionally substituted $C_1$-$C_{40}$ heteroaryl group; an optionally substituted $C_1$-$C_{40}$ alkoxy group; an optionally substituted $C_6$-$C_{40}$ aryloxy group; an optionally substituted $C_7$-$C_{40}$ alkylaryloxy group; an optionally substituted $C_2$-$C_{40}$ alkoxycarbonyl group; an optionally substituted $C_7$-$C_{40}$ aryloxycarbonyl group; a cyano group (—CN); a carbamoyl group (—C(=O)$NR^{15}R^{16}$); a carbonyl group (—C(=O)—$R^{17}$); a carboxyl group (—$CO_2R^{18}$) a cyanate group (—OCN); an isocyano group (—NC); an isocyanate group (—NCO); a thiocyanate group (—SCN) or a thioisocyanate group (—NCS); an optionally substituted amino group; a hydroxy group; a nitro group; a $CF_3$ group; a halo group (Cl, Br, F, I); —$SR^{19}$; —$SO_3H$; —$SO_2R^{20}$;—$SF_5$; an optionally substituted silyl group;

wherein at least two of $R^1$, $R^3$, $R^4$, $R^6$, $R^7$, $R^9$, $R^{10}$, and $R^{12}$, are a bond, represented by ——*, to another monomer unit having the Formula (A), (B), or (C); and wherein each $R^{1\prime}$, $R^{2\prime}$, $R^{3\prime}$ and $R^{4\prime}$, each of which may be the same or different, is selected from the same group as $R^1$, $R^2$, $R^3$, $R^4$ already defined above for monomer (A) and for the monomer group (A), ——* represents a bond to another monomer unit having the Formula (A), (B) or (C)

wherein $Ar_1$, $Ar_2$ and $Ar_3$, which may be the same or different, each represent, independently, an optionally substituted $C_{6\text{-}40}$ aromatic group (mononuclear or polynuclear), wherein X' is a cyclic boronate group; and wherein Z' is a halogen atom.

24. A Polycyclic Aromatic Hydrocarbon Copolymer (PAHC) obtained by a process of claim 23.

25. An organic semiconductor layer comprising an organic semiconductor composition according to claim 14.

26. An electronic device comprising an organic semiconductor composition according to claim 14.

27. An electronic device comprising a layer of the semiconducting composition according to claim 16.

28. A PAHC according to claim 1, wherein at least one of $Ar_1$, $Ar_2$ and $Ar_3$ is substituted with at least one polar group and for the monomer group (C), ——* represents a bond to another monomer unit having the Formula (A), (B) or (C).

29. A PAHC according to claim 3, comprising 15-30% (of the total of all monomer units (A), (B) and (C) in the copolymer or composition) of monomer unit (A), 50-85 wt. %, of monomer unit (B), and 20-50% of monomer unit (C).

30. A PAHC according to claim 5, wherein the number of repeat units in the copolymer is 1 to 10.

31. A PAHC according to claim 6, wherein a monomer unit having the Formula (C) is present in an amount of 20-50 %.

32. A PAHC according to claim 11, wherein the copolymers are semiconducting random copolymers having a permittivity at 1000 Hz of between 3.4 and 8.

33. An organic semiconductor composition comprising a PAHC according to claim 14, wherein the PAHC has a permittivity at 1000 Hz of between 3.4 and 4.5.

34. An organic semiconductor composition comprising a PAHC according to claim 15, wherein the non-polymerized BXBX molecule is a BXBX molecule having the Formula (5):

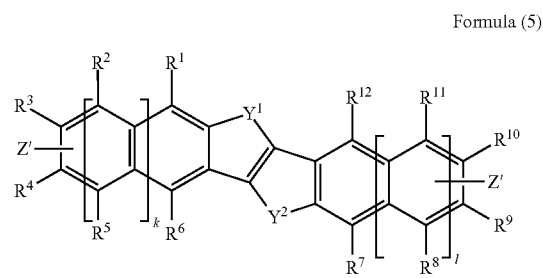

Formula (5)

wherein the PAHC has a permittivity at 1000Hz of between 3.4 and 8.0, and wherein k is 0 or 1; 1 is 0 or 1; wherein each of $R^1$, $R^2$, $R^3$, $R^4$, $R^5$, $R^6$, $R^7$, $R^8$, $R^9$, $R^{10}$, $R^{11}$ and $R^{12}$, which may be the same or different, independently represents hydrogen; a branched or unbranched, substituted or unsubstituted $C_1$-$C_{40}$ alkyl group; a branched or unbranched, substituted or unsubstituted $C_2$-$C_{40}$ alkenyl group; a branched or unbranched, substituted or unsubstituted $C_2$-$C_{40}$ alkynyl group; an optionally substituted $C_3$-$C_{40}$ cycloalkyl group; an optionally substituted $C_6$-$C_{40}$ aryl group; an optionally substituted $C_1$-$C_{40}$ heterocyclic group; an optionally substituted $C_1$-$C_{40}$ heteroaryl group; an optionally substituted $C_1$-$C_{40}$ alkoxy group; an optionally substituted $C_6$-$C_{40}$ aryloxy group; an optionally substituted $C_7$-$C_{40}$ alkylaryloxy group; an optionally substituted $C_2$-$C_{40}$ alkoxycarbonyl group; an optionally substituted $C_7$-$C_{40}$ aryloxycarbonyl group; a cyano group (—CN); a carbamoyl group (—C(=O)$NR^{15}R^{16}$); a carbonyl group (—C(=O)—$R^{17}$); a carboxyl group (—$CO_2R^{18}$) a cyanate group (—OCN); an isocyano group (—NC); an isocyanate group (—NCO); a thiocyanate group (—SCN) or a thioisocyanate group (—NCS); an optionally substituted amino group; a hydroxy group; a nitro group; a $CF_3$ group; a halo group (Cl, Br, F, I); —$SR^{19}$; —$SO_3H$; —$SO_2R^{20}$; —$SF_5$; an optionally substituted silyl group, and wherein Z' is a halogen, a cyclic boronate, or has the same meaning as $R^1$.

35. An organic semiconductor composition according to claim 34, wherein the composition has a permittivity at 1000 Hz of between 3.4 and 4.5.

36. An organic semiconductor composition according to claim 17, wherein the organic binder has a permittivity at 1000 Hz of between 4 and 6.5.

37. An organic semiconductor composition according to claim 18, having a charge mobility value of between 2.0 and 8.0 $cm^2V^{-1}s^{-1}$.

* * * * *

UNITED STATES PATENT AND TRADEMARK OFFICE
CERTIFICATE OF CORRECTION

PATENT NO. : 10,069,071 B2
APPLICATION NO. : 14/911092
DATED : September 4, 2018
INVENTOR(S) : Russell Jon Griffiths Page 1 of 1

It is certified that error appears in the above-identified patent and that said Letters Patent is hereby corrected as shown below:

In the Claims

In Claim 1, Column 38, Lines 55-66, delete the entire contents and

Formula (A)

insert --
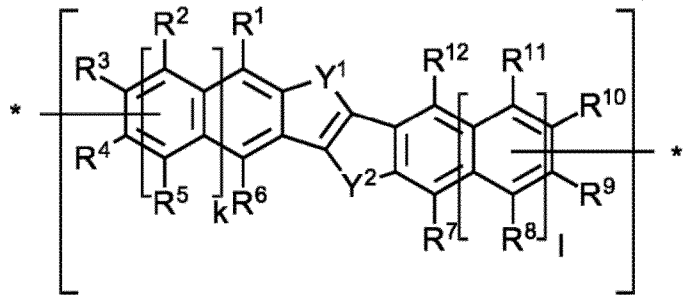
-- therefor.

In Claim 2, Columns 39-40, Lines 16-39, delete the entire contents and

Formula (1)

insert --
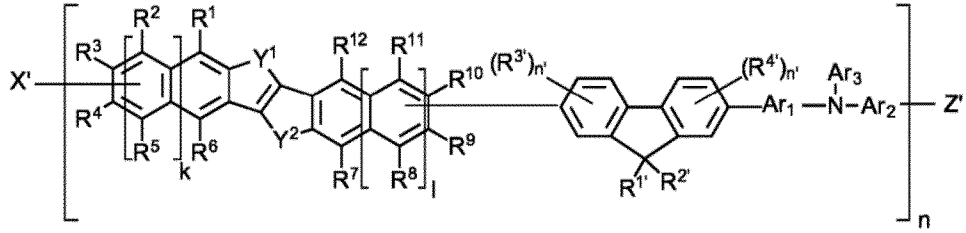
-- therefor.

Signed and Sealed this
Sixth Day of November, 2018

Andrei Iancu
*Director of the United States Patent and Trademark Office*